US012143735B2

United States Patent
Maruyama et al.

(10) Patent No.: US 12,143,735 B2
(45) Date of Patent: Nov. 12, 2024

(54) SOLID-STATE IMAGING DEVICE AND IMAGING DEVICE

(71) Applicant: Sony Semiconductor Solutions Corporation, Kanagawa (JP)

(72) Inventors: Takuya Maruyama, Kanagawa (JP); Tsutomu Imoto, Kanagawa (JP); Atsumi Niwa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 18 days.

(21) Appl. No.: 17/928,129

(22) PCT Filed: Apr. 26, 2021

(86) PCT No.: PCT/JP2021/016652
§ 371 (c)(1),
(2) Date: Nov. 28, 2022

(87) PCT Pub. No.: WO2021/261070
PCT Pub. Date: Dec. 30, 2021

(65) Prior Publication Data
US 2023/0209218 A1 Jun. 29, 2023

(30) Foreign Application Priority Data
Jun. 26, 2020 (JP) ................................. 2020-110957

(51) Int. Cl.
*H04N 25/47* (2023.01)
*H01L 27/146* (2006.01)
(Continued)

(52) U.S. Cl.
CPC ............. *H04N 25/47* (2023.01); *H04N 25/42* (2023.01); *H04N 25/77* (2023.01); *H04N 25/78* (2023.01); *H01L 27/14634* (2013.01)

(58) Field of Classification Search
CPC .. H01L 27/14634; H04N 25/42; H04N 25/47; H04N 25/77; H04N 25/18; H04N 25/46;
(Continued)

(56) References Cited

U.S. PATENT DOCUMENTS 11,659,304 B2 * 5/2023 Niwa ..................... H04N 25/79
11,936,996 B2 * 3/2024 Niwa ..................... H04N 25/79
(Continued)

FOREIGN PATENT DOCUMENTS

JP 5244587 B2 4/2013
JP WO2019146527 A1 * 1/2019 ....... H01L 27/14609
(Continued)

OTHER PUBLICATIONS

International Search Report (PCT/ISA/210), International Application No. PCT/JP2021/016652, dated Jun. 22, 2021.
PTO 892 Form received with the Notice of Allowance issued Jul. 17, 2024 and marked up showing Examiner error and correct application number.

*Primary Examiner* — Marly S Camargo
(74) *Attorney, Agent, or Firm* — Michael Best & Friedrich LLP

(57) ABSTRACT

Solid-state imaging devices are disclosed. In one example, a solid-state imaging device includes detection pixels that each output a luminance change of incident light, a detection circuit that outputs an event signal based on the luminance change, and a first common line connecting the detection pixels to each other. Each of the detection pixels may include a photoelectric conversion element, a logarithmic conversion circuit that outputs a voltage signal corresponding to a logarithmic value of photocurrent from the photoelectric conversion element, a first circuit that outputs a luminance change of incident light based on the voltage signal, a first transistor connected between the photoelectric conversion element and the logarithmic conversion circuit, and a second transistor connected between the photoelectric
(Continued)

conversion element and the first common line. The detection circuit includes a second circuit that outputs the event signal based on the luminance change output from each of the detection pixels.

19 Claims, 33 Drawing Sheets

(51) Int. Cl.
*H04N 25/42* (2023.01)
*H04N 25/46* (2023.01)
*H04N 25/57* (2023.01)
*H04N 25/703* (2023.01)
*H04N 25/707* (2023.01)
*H04N 25/76* (2023.01)
*H04N 25/77* (2023.01)
*H04N 25/78* (2023.01)

(58) Field of Classification Search
CPC .... H04N 25/76; H04N 25/573; H04N 25/703; H04N 25/707; H04N 25/78
See application file for complete search history.

(56) References Cited

U.S. PATENT DOCUMENTS

| | | | |
|---|---|---|---|
| 2020/0358977 A1* | 11/2020 | Niwa | H04N 15/53 |
| 2023/0106422 A1* | 4/2023 | Sasaki | H04N 25/47 |
| 2023/0156355 A1* | 5/2023 | Kim | H04N 25/77 |
| 2023/0247314 A1* | 8/2023 | Imoto | H01L 27/14612 |
| 2024/0027645 A1* | 1/2024 | Niwa | H04N 25/702 |
| 2024/0072093 A1* | 2/2024 | Miyake | H01L 27/14636 |
| 2024/0120353 A1 | 4/2024 | Hanzawa et al. | H01L 21/822 |
| 2024/0121353 A1* | 4/2024 | Hanzawa | H01L 21/822 |

FOREIGN PATENT DOCUMENTS

| | | |
|---|---|---|
| JP | 2019134202 A | 8/2019 |
| JP | 2020072317 A | 5/2020 |
| JP | 2020088676 A | 6/2020 |
| TW | 201941588 A | 10/2019 |
| WO | 2019146178 A1 | 8/2019 |
| WO | 2019146527 A1 | 8/2019 |
| WO | WO-2020066803 A1 | 4/2020 |
| WO | 2020090460 A1 | 5/2020 |
| WO | 2020110743 A1 | 6/2020 |

* cited by examiner

SOLID-STATE IMAGING DEVICE AND IMAGING DEVICE

FIELD

The present disclosure relates to a solid-state imaging device and an imaging device.

BACKGROUND

Conventional technologies related to imaging devices, or the like have used a synchronous solid-state imaging device that captures image data (frames) in synchronization with a synchronization signal such as a vertical synchronization signal. This typical synchronous solid-state imaging device can only acquire image data every synchronization signal period (for example, 1/60 second), making it difficult to deal with faster processing when required in fields related to transportation, robots, or the like. To handle this, there has been proposed an asynchronous solid-state imaging device that detects, for each pixel address, an event that the change amount of the luminance of the pixel has exceeded a threshold, as an address event (refer to Patent Literature 1, for example). The solid-state imaging device that detects an address event for each pixel in this manner is also referred to as an Event-based Vision Sensor (EVS) or a Dynamic Vision Sensor (DVS).

CITATION LIST

Patent Literature

Patent Literature 1: JP 5244587 B2

SUMMARY

Technical Problem

In the above-described asynchronous solid-state imaging device, the transistors constituting an address event detection circuit operate in a subthreshold region, and thus, the dynamic range at low illuminance greatly depends on the SN ratio, being a ratio of the photocurrent (S) to the thermal noise (N) in the transistors. In particular, pixel microfabrication, when performed along with trends of miniaturization and high resolution, would cause a decrease in the photocurrent per pixel, resulting in deterioration of the SN ratio and a narrower dynamic range at low illuminance. This can cause problems such as a decrease in sensitivity to the occurrence of an address event and an increase in errors in detection.

In view of this, the present disclosure proposes a solid-state imaging device and an imaging device capable of obtaining a dynamic range even at low illuminance.

Solution to Problem

To solve the above-described problem, a solid-state imaging device according to one aspect of the present disclosure comprises: a plurality of detection pixels that each output a luminance change of incident light; a detection circuit that outputs an event signal based on the luminance change output from each of the detection pixels; and a first common line connecting the plurality of detection pixels to each other, wherein each of the detection pixels includes: a photoelectric conversion element; a logarithmic conversion circuit that converts a photocurrent flowing out of the photoelectric conversion element into a voltage signal corresponding to a logarithmic value of the photocurrent; a first circuit that outputs a luminance change of incident light incident on the photoelectric conversion element based on the voltage signal output from the logarithmic conversion circuit; a first transistor connected between the photoelectric conversion element and the logarithmic conversion circuit; and a second transistor connected between the photoelectric conversion element and the first common line, and the detection circuit includes a second circuit that outputs the event signal based on the luminance change output from each of the detection pixels.

DESCRIPTION OF EMBODIMENTS

Figure 1:
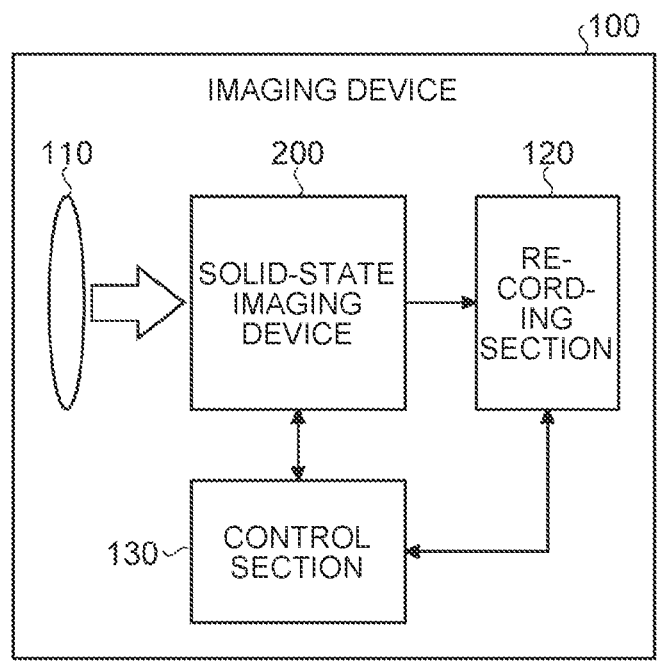
FIG. 1 is a block diagram depicting a configuration example of an imaging device according to a first embodiment.

An embodiment of the present disclosure will be described below in detail with reference to the drawings. In each of the following embodiments, the same parts are denoted by the same reference symbols, and a repetitive description will be omitted.

The present disclosure will be described in the following order.

1. First Embodiment
1.1 Configuration example of imaging device
1.2 Configuration example of solid-state imaging device
1.3 Configuration example of logarithmic response section
1.3.1 Modification of logarithmic response section
1.4 Configuration example of detection block
1.4.1 Configuration example of differentiator, selector, and comparator
1.5 Control example of row drive circuit
1.6 Configuration example of detection pixel and detection circuit
1.6.1 Operation example of solid-state imaging device
1.7 Modification of detection pixel and detection circuit
1.7.1 Control example of row drive circuit according to modification
1.8 Configuration example of shared block
1.9 Layout example of shared block
1.10 Operation example
1.10.1 Timing chart
1.10.2 Flowchart
1.11 Action and effects
2. Second Embodiment
2.1 Configuration example of shared block
2.2 Layout example of shared block
2.3 Operation example (timing chart)
2.4 Action and effects
3. Third Embodiment
3.1 Configuration example of shared block
3.2 Operation example (timing chart)
3.3 Action and effects
4. Fourth Embodiment
4.1 Configuration example of shared block
4.1.1 Modification of shared block
4.2 Configuration example of readout circuit
4.3 Configuration example of detection chip
4.4 Operation example
4.5 Action and effects
5. Fifth Embodiment
5.1 Configuration example of shared block
5.1.1 Modification of shared block
5.2 Operation example
6. Sixth Embodiment
7. Example of application to moving object 1. First Embodiment First, a first embodiment will be described in detail with reference to the drawings.

1.1 Configuration Example of Imaging Device

FIG. 1 is a block diagram depicting a configuration example of an imaging device 100 according to the first embodiment of the present disclosure. The imaging device 100 includes an optical section 110, a solid-state imaging device 200, a recording section 120, and a control section 130. Assumed examples of the imaging device 100 include devices such as a camera mounted on an industrial robot, and an in-vehicle camera.

The optical section 110 condenses incident light and guides the condensed light to the solid-state imaging device 200. The solid-state imaging device 200 photoelectrically converts the incident light to generate image data. The solid-state imaging device 200 executes predetermined signal processing such as image recognition processing on the generated image data, and outputs the processed data to the recording section 120 through a signal line 209.

The recording section 120 includes devices such as flash memory, for example, and records data output from the solid-state imaging device 200 and data output from the control section 130.

The control section 130 includes an information processing device such as an application processor, for example, and controls the solid-state imaging device 200 to output image data.

1.2 Configuration Example of Solid-State Imaging Device

Example of Stacked Structure

Figure 2:
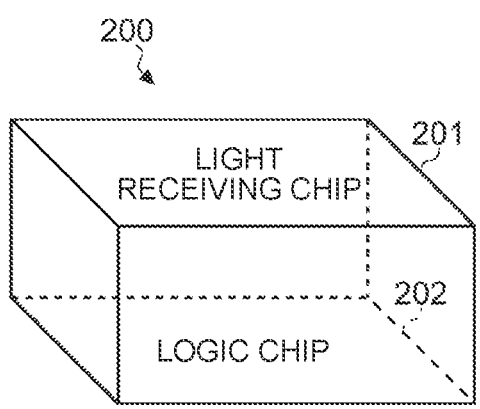
FIG. 2 is a diagram depicting an example of a stacked structure of the solid-state imaging device according to the first embodiment.

FIG. 2 is a diagram depicting an example of a stacked structure of the solid-state imaging device 200 according to the present embodiment. The solid-state imaging device 200 includes a detection chip 202 and a light receiving chip 201 stacked on the detection chip 202. These chips are electrically connected to each other through a connection portion such as a via. In addition to the via, Cu—Cu bonding or a bump can be used for the connection. For example, the light receiving chip 201 may be an example of a first chip in the claims, and the detection chip 202 may be an example of a second chip in the claims.

Layout Example of Light Receiving Chip

Figure 3:
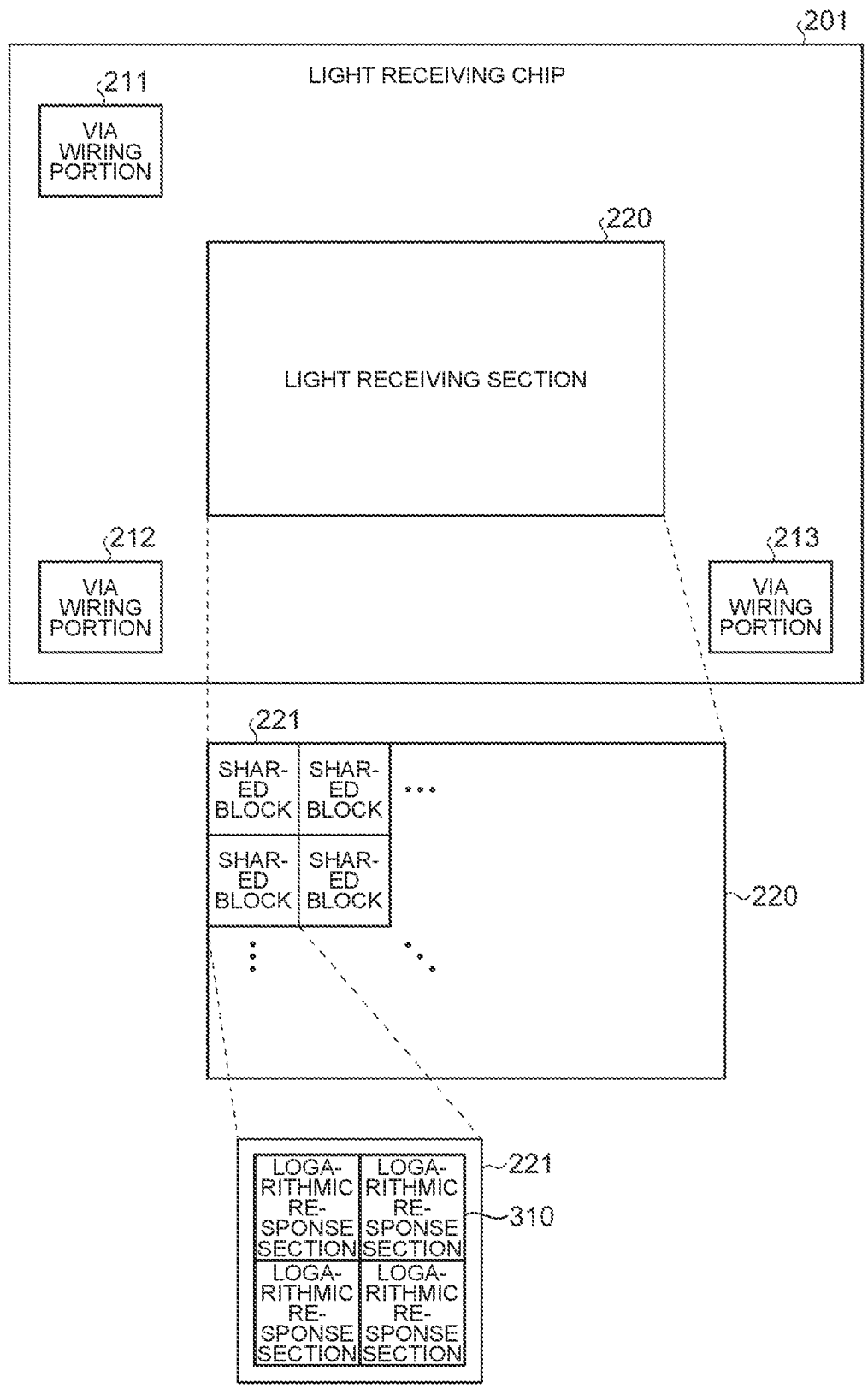
FIG. 3 is an example of a plan view of a light receiving chip according to the first embodiment.

FIG. 3 is an example of a plan view of the light receiving chip 201 according to the present embodiment. The light receiving chip 201 includes a light receiving section 220 and via arrangement portions 211, 212, and 213.

The via arrangement portions 211, 212, and 213 are portions where vias connected to the detection chip 202 are arranged. The light receiving section 220 is a place where a plurality of shared blocks 221 is arranged in a two-dimensional lattice pattern.

In each of the shared blocks 221, one or more logarithmic response sections 310 are arranged. For example, four logarithmic response sections 310 are arranged in a 2 row×2 column pattern for each shared block 221. These four logarithmic response sections 310 share a circuit on the detection chip 202. Details of the shared circuit will be described below. The number of logarithmic response sections 310 in the shared block 221 is not limited to four. In addition, a part or all of the circuit configuration excluding the photoelectric conversion element 311 in each logarithmic response section 310 may be arranged on the detection chip 202 side.

The logarithmic response section 310 converts the photocurrent flowing out of the photoelectric conversion element 311 into a voltage signal corresponding to the logarithmic value of the photocurrent. A pixel address including a row address and a column address is assigned to each logarithmic response section 310. Note that the pixel in the present disclosure may have a configuration based on a photoelectric conversion element 311 to be described below, and the pixel in the present embodiment may have a configuration corresponding to a detection pixel 300 to be described below, for example.

Layout Example of Detection Chip

Figure 4:
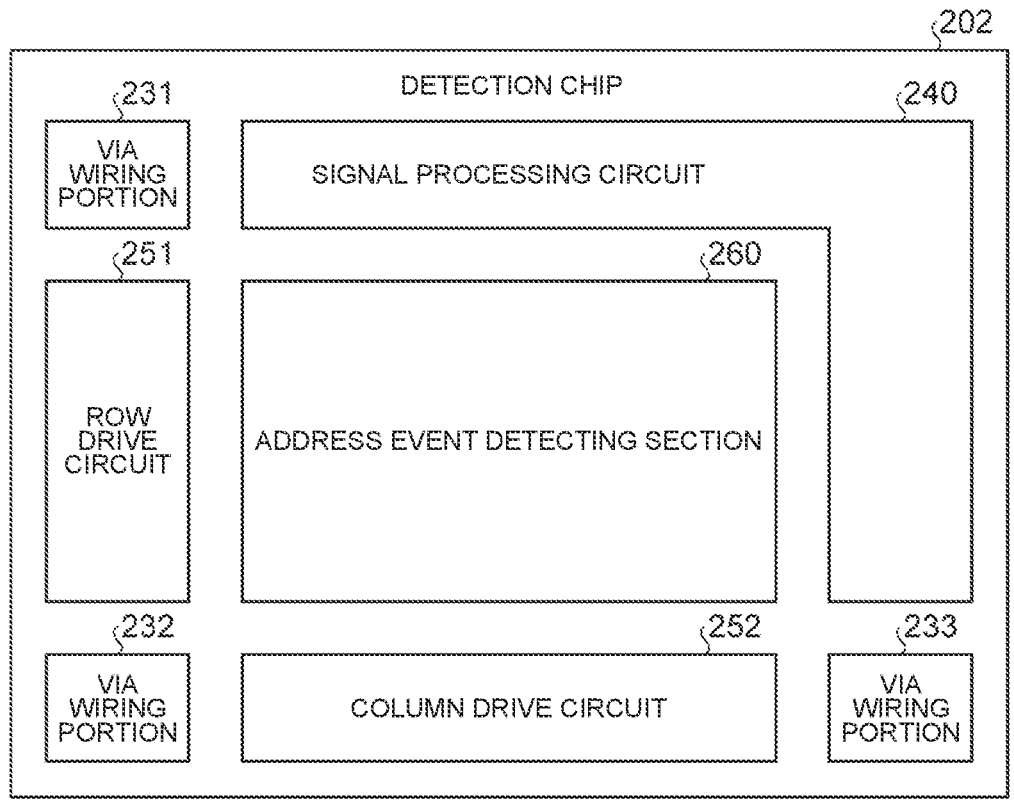
FIG. 4 is an example of a plan view of a detection chip according to the first embodiment.

FIG. 4 is an example of a plan view of the detection chip 202 according to the present embodiment. The detection chip 202 includes via arrangement portions 231, 232, and 233, a signal processing circuit 240, a row drive circuit 251, a column drive circuit 252, and an address event detecting section 260. The via arrangement portions 231, 232, and 233 are portions where vias connected to the light receiving chip 201 are arranged.

The address event detecting section 260 detects the presence or absence of an address event for each logarithmic response section 310 and generates a detection signal indicating a detection result.

The row drive circuit 251 selects a row address and causes the address event detecting section 260 to output a detection signal corresponding to the row address.

The column drive circuit 252 selects a column address and causes the address event detecting section 260 to output a detection signal corresponding to the column address.

The signal processing circuit 240 performs predetermined signal processing on the detection signal output from the address event detecting section 260. The signal processing circuit 240 arranges the detection signals as pixel signals in a two-dimensional lattice pattern, and generates image data having 2-bit information for each pixel. The signal processing circuit 240 then executes signal processing such as image recognition processing on the image data.

Layout Example of Detection Chip

Figure 5:
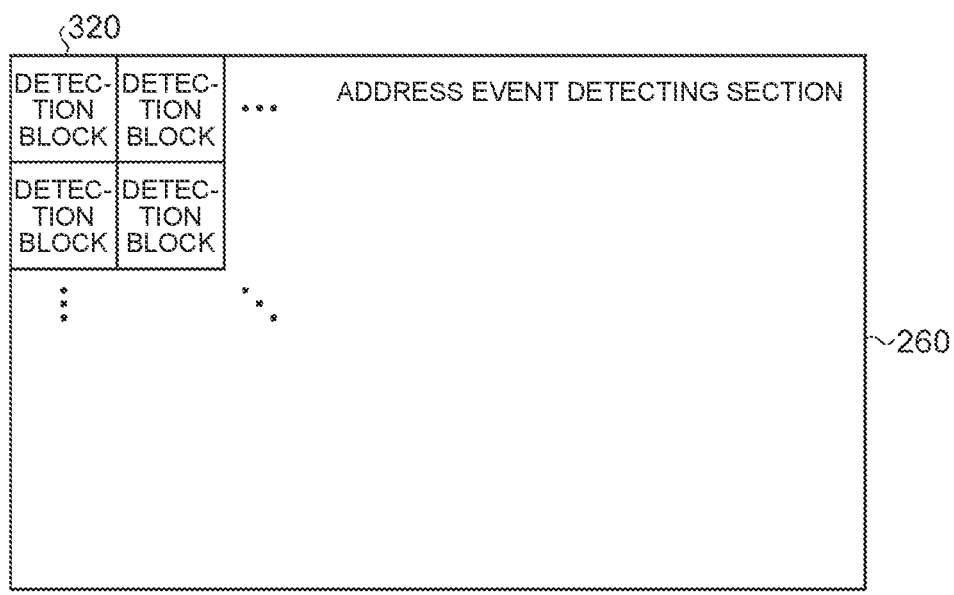
FIG. 5 is an example of a plan view of an address event detecting section according to the first embodiment.

FIG. 5 is an example of a plan view of the address event detecting section 260 according to the present embodiment. The address event detecting section 260 is a section in which a plurality of detection blocks 320 is arranged. The detection block 320 is arranged for each shared block 221 on the light receiving chip 201. In a case where the number of the shared blocks 221 is N (N is an integer), N detection blocks 320 are arranged. Each detection block 320 is connected to the corresponding shared block 221.

1.3 Configuration Example of Logarithmic Response Section

Figure 6:
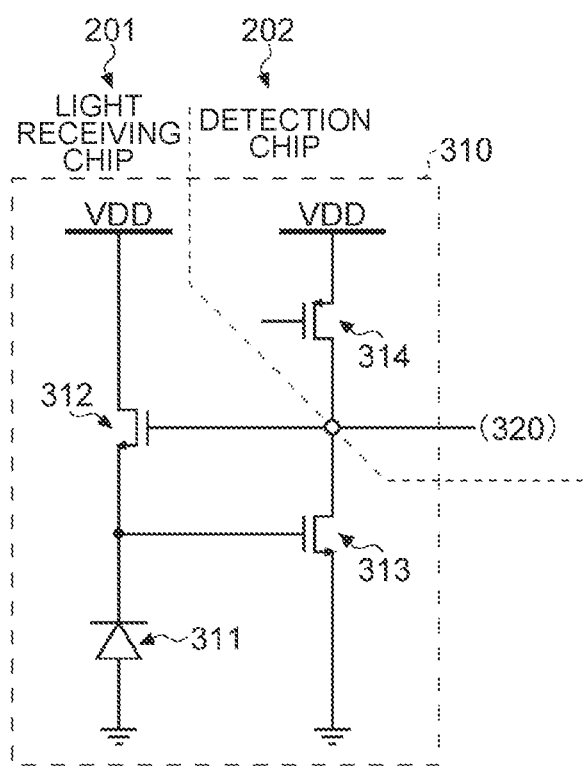
FIG. 6 is a circuit diagram depicting a configuration example of a logarithmic response section according to the first embodiment.

FIG. 6 is a circuit diagram depicting a basic configuration example of a logarithmic response section according to the present embodiment. The logarithmic response section 310 includes a photoelectric conversion element 311, n-channel metal oxide semiconductor (nMOS) transistors 312 and 313, and a p-channel MOS (pMOS) transistor 314. Among these, the two nMOS transistors 312 and 313 constitute, for example, a logarithmic conversion circuit that converts the photocurrent flowing out of the photoelectric conversion element 311 into a voltage signal corresponding to the logarithmic value of the photocurrent. Further, the pMOS transistor 314 operates as a load MOS transistor for the logarithmic conversion circuit. Note that the photoelectric conversion element 311 and the nMOS transistors 312 and 313 can be arranged on the light receiving chip 201, while the pMOS transistor 314 can be arranged on the detection chip 202, for example.

Regarding the nMOS transistor 312, its source is connected to a cathode of the photoelectric conversion element 311, while is drain is connected to a power supply terminal. The pMOS transistor 314 and the nMOS transistor 313 are connected in series between the power supply terminal and the ground terminal. Further, a connection point of the pMOS transistor 314 and the nMOS transistor 313 is connected to a gate of the nMOS transistor 312 and an input terminal of the detection block 320. Further, a predetermined bias voltage Vbias1 is applied to the gate of the pMOS transistor 314.

The drains of the nMOS transistors 312 and 313 are connected to the power supply side, and such a circuit is referred to as a source follower. The two source followers connected in the loop shape converts the photocurrent from the photoelectric conversion element 311 into a voltage signal corresponding to the logarithmic value. Further, the pMOS transistor 314 supplies a constant current to the nMOS transistor 313.

In addition, the ground of the light receiving chip 201 and the ground of the detection chip 202 are isolated from each other for a countermeasure against interference.

1.3.1 Modification of Logarithmic Response Section

Figure 7:
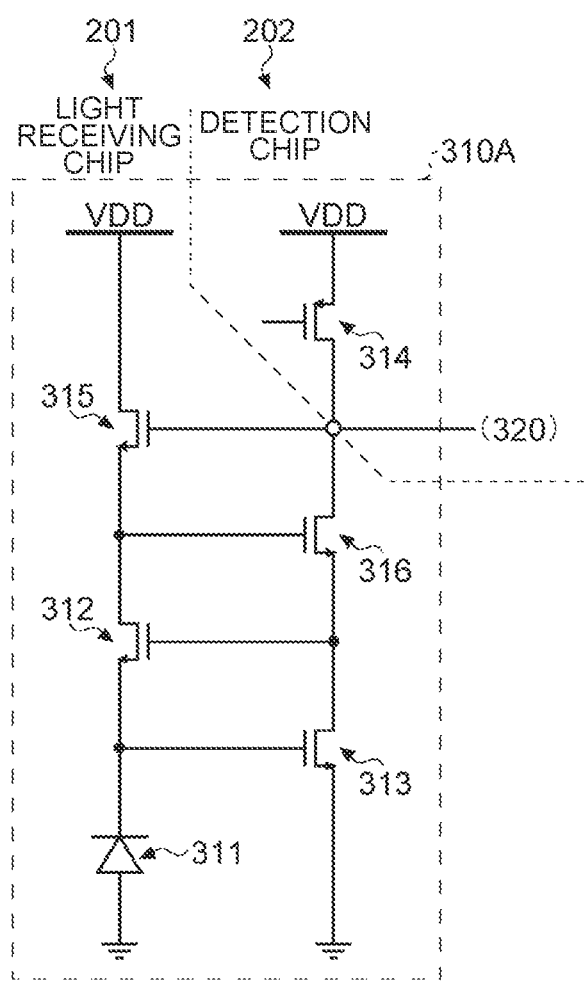
FIG. 7 is a circuit diagram depicting another configuration example of the logarithmic response section according to the first embodiment.

Although FIG. 6 is an example of configuration of the source follower type logarithmic response section 310, the configuration of the section is not limited to such an example. FIG. 7 is a circuit diagram depicting a basic configuration example of a logarithmic response section according to a modification of the present embodiment. As depicted in FIG. 7, for example, a logarithmic response section 310A has a configuration, referred to as a gain boost type circuit configuration, including an additional nMOS transistor 315, connected in series between the nMOS transistor 312 and a power supply line, and an additional nMOS transistor 316, connected in series between the nMOS transistor 313 and the pMOS transistor 314, with respect to the source follower type circuit configuration depicted in FIG. 6. The four nMOS transistors 312, 313, 315, and 316 constitute, for example, a logarithmic conversion circuit that converts the photocurrent flowing out of the photoelectric conversion element 311 into a voltage signal corresponding to the logarithmic value of the photocurrent.

In this manner, even with the use of the gain boost type logarithmic response section 310A, it is possible to convert the photocurrent from the photoelectric conversion element 311 into a voltage signal of a logarithmic value corresponding to the charge amount.

1.4 Configuration Example of Detection Block

Figure 8:
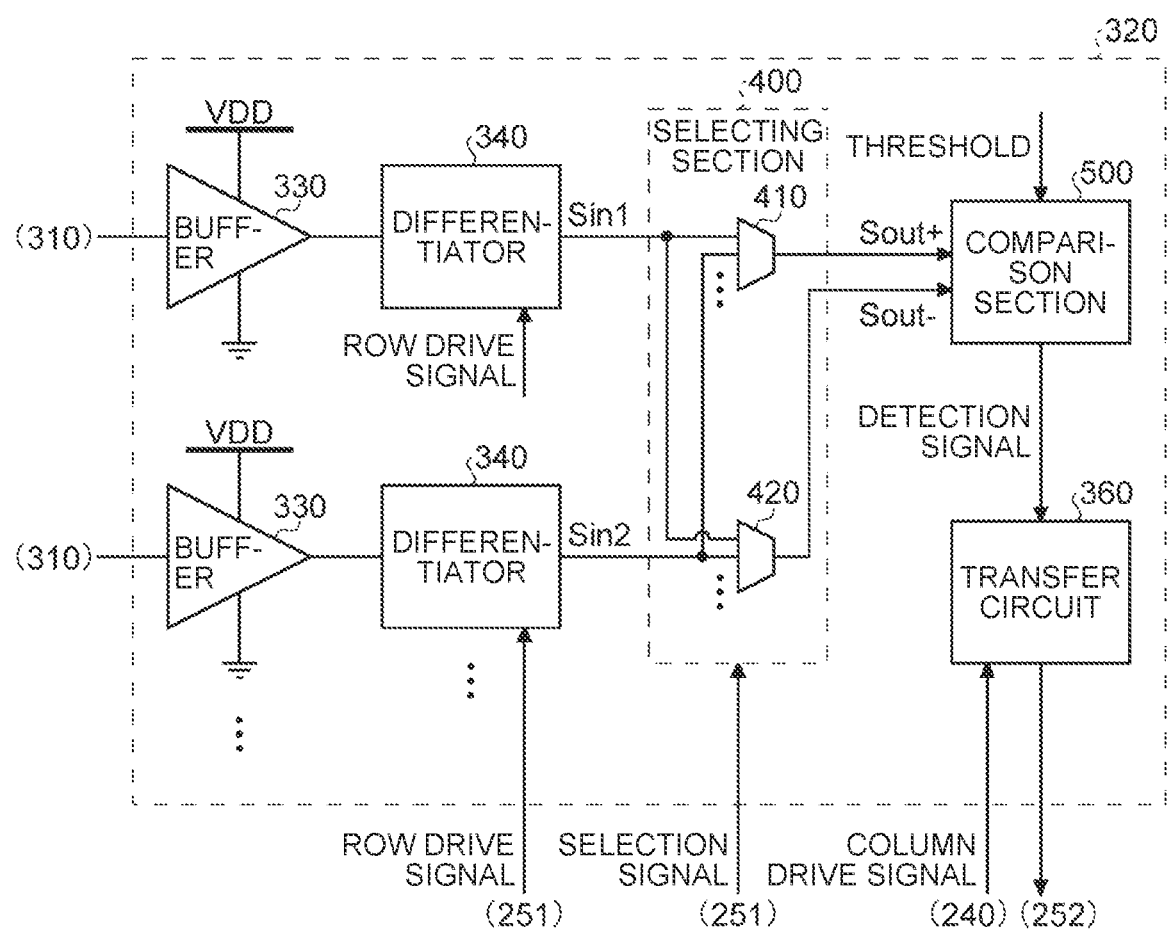
FIG. 8 is a block diagram depicting a configuration example of a detection block according to the first embodiment.

FIG. 8 is a block diagram depicting a configuration example of the detection block 320 according to the present embodiment. The detection block 320 includes a plurality of buffers 330, a plurality of differentiators 340, a selecting section 400, a comparison section 500, and a transfer circuit 360. The buffer 330 and the differentiator 340 are arranged for each logarithmic response section 310 in the shared block 221. For example, when the number of logarithmic response sections 310 in the shared block 221 is four, four buffers 330 and four differentiators 340 are arranged.

The buffer 330 outputs the voltage signal from the corresponding logarithmic response section 310 to the differentiator 340. The buffer 330 can improve the driving force used for driving the subsequent stage. In addition, the buffer 330 can ensure isolation of noise associated with a switching operation in the subsequent stage.

The differentiator 340 obtains a change amount of the voltage signal, that is, a luminance change of the light incident on the photoelectric conversion element 311 as a differential signal. The differentiator 340 receives a voltage signal from the corresponding logarithmic response section 310 through the buffer 330, and obtains a change amount of the voltage signal by differentiation. Subsequently, the differentiator 340 supplies the differential signal to the selecting section 400. An m-th (m is an integer of 1 to M,) differential signal Sin in the detection block 320 is defined as Sinm. The differentiator 340 can correspond to, for example, a first circuit in the claims.

The selecting section 400 selects one of the M differential signals according to a selection signal from the row drive circuit 251. The selecting section 400 includes selectors 410 and 420.

M differential signals Sin are input to the selector 410. The selector 410 selects one of these differential signals Sin according to the selection signal, and supplies the selected differential signal Sin to the comparison section 500 as Sout+. M differential signals Sin are also input to the selector 420. The selector 420 selects one of these differential signals Sin according to the selection signal, and supplies the selected differential signal Sin to the comparison section 500 as Sout−.

The comparison section 500 compares the differential signal (that is, the change amount) selected by the selecting section 400 with a predetermined threshold. The comparison section 500 supplies a signal indicating a comparison result to the transfer circuit 360 as a detection signal. The comparison section 500 can correspond to a second circuit in the claims, for example.

The transfer circuit 360 transfers the detection signal to the signal processing circuit 240 according to the column drive signal from the column drive circuit 252.

Configuration Example of Differentiator

Figure 9:
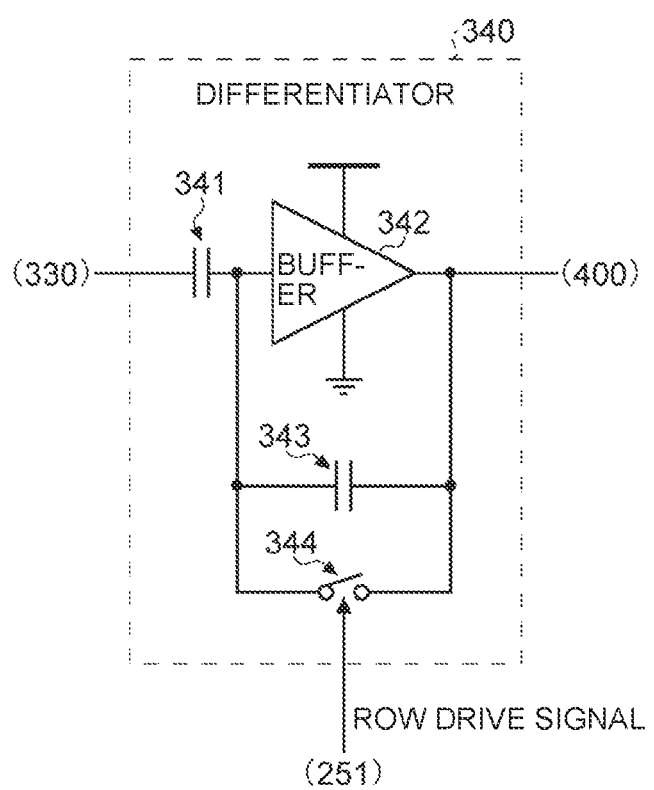
FIG. 9 is a circuit diagram depicting a configuration example of a differentiator according to the first embodiment.

FIG. 9 is a circuit diagram depicting a configuration example of the differentiator 340 according to the present embodiment. The differentiator 340 includes capacitors 341 and 343, an inverter 342, and a switch 344.

The capacitor 341 has one end connected to the output terminal of the buffer 330 and the other end connected to the input terminal of the inverter 342. The capacitor 343 is connected in parallel to the inverter 342. The switch 344 opens and closes a path connecting the ends of the capacitor 343 according to the row drive signal.

The inverter 342 inverts the voltage signal input through the capacitor 341. The inverter 342 outputs the inverted signal to the selecting section 400.

When the switch 344 is turned on, a voltage signal $V_{init}$ is input to the buffer 330 side of the capacitor 341, causing the opposite side to be a virtual ground terminal. The potential of the virtual ground terminal is assumed to zero for convenience. At this time, when the capacitance of the capacitor 341 is C1, a potential $Q_{init}$ accumulated in the capacitor 341 is expressed by the following Formula (1). On the other hand, since both ends of the capacitor 343 are short-circuited, accumulated charge is 0.

$$Q_{init} = C1 \times V_{init} \quad (1)$$

Next, in an assumed case where the switch 344 is turned off and the voltage on the buffer 330 side of the capacitor 341 has changed to a voltage $V_{after}$, charge $Q_{after}$ accumulated in the capacitor 341 is expressed by the following Formula (2).

$$Q_{after} = C1 \times V_{after} \quad (2)$$

On the other hand, when the output voltage is $V_{out}$, charge Q2 accumulated in the capacitor 343 is expressed by the following Formula (3).

$$Q2 = -C2 \times V_{out} \quad (3)$$

At this time, since the total charge amounts of the capacitors 341 and 343 do not change, the following Formula (4) holds.

$$Q_{init} = Q_{after} + Q2 \quad (4)$$

When Formulas (1) to (3) are substituted into Formula (4) and the result can be transformed into the following Formula (5).

$$V_{out} = -(C1/C2) \times (V_{after} - V_{init}) \quad (5)$$

Formula (5) represents a subtraction operation of the voltage signals, in which the gain for the subtraction result is C1/C2. Since maximized gain is desirable in usual cases, it is preferable to design C1 to be large and C2 to be small. On the other hand, excessively small C2 would increase kTC noise and cause deterioration in noise characteristics. Therefore, capacity reduction of C2 is limited to a noise tolerable range. In addition, since the differentiator 340 is provided for each pixel, the capacitances C1 and C2 have area restrictions. In consideration of these, for example, C1 is set to a value of 20 to 200 femtofarad (fF), and C2 is set to a value of 1 to 20 femtofarad (fF).

Configuration Example of Comparison Section

Figure 10:
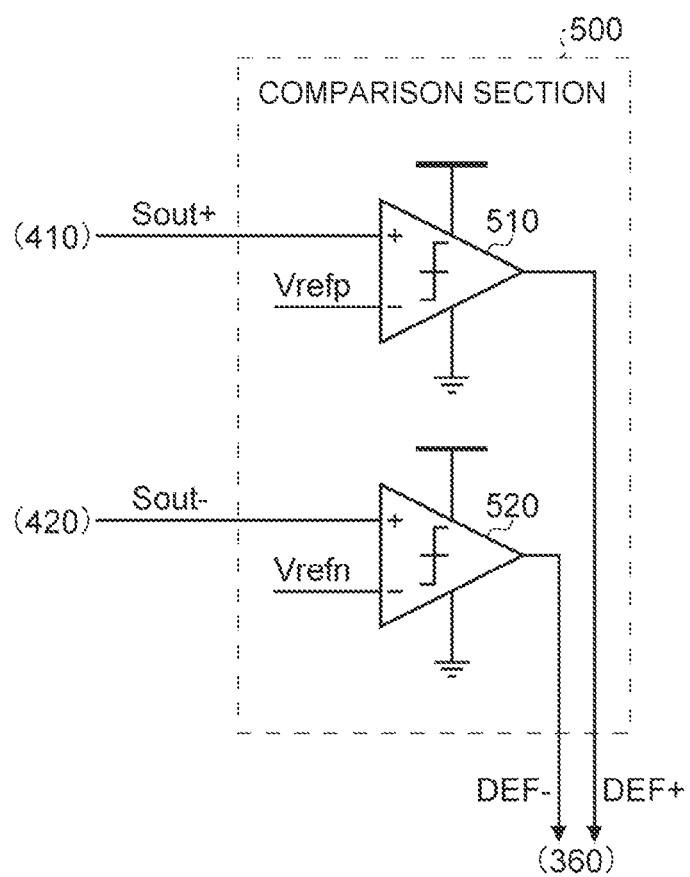
FIG. 10 is a circuit diagram depicting a configuration example of a comparison section according to the first embodiment.

FIG. 10 is a circuit diagram depicting a configuration example of the comparison section 500 according to the present embodiment. The comparison section 500 includes comparators 510 and 520.

The comparator 510 compares the differential signal Sout+ from the selector 410 with a predetermined upper threshold Vrefp. The comparator 510 supplies a result of the comparison to the transfer circuit 360 as a detection signal DET+. The detection signal DET+ indicates the presence or absence of an on-event. Here, the on-event represents an event that the change amount of the luminance exceeds a predetermined upper threshold.

The comparator 520 compares the differential signal Sout– from the selector 420 with a lower threshold Vrefn lower than the upper threshold Vrefp. The comparator 520 supplies a result of the comparison to the transfer circuit 360 as a detection signal DET–. The detection signal DET– indicates the presence or absence of an off-event. Here, the off-event represents an event that the change amount of the luminance is less than the predetermined lower threshold. Note that although the comparison section 500 detects the presence or absence of both the on-event and the off-event, it is also possible to detect only one of the on-event and the off-event.

Note that, for example, the comparator 510 may be an example of a first comparator described in the claims, and the comparator 520 may be an example of a second comparator described in the claims. For example, the upper threshold may be an example of a first threshold described in the claims, and the lower threshold may be an example of a second threshold described in the claims.

1.4.1 Configuration Example of Differentiator, Selector, and Comparator

Figure 11:
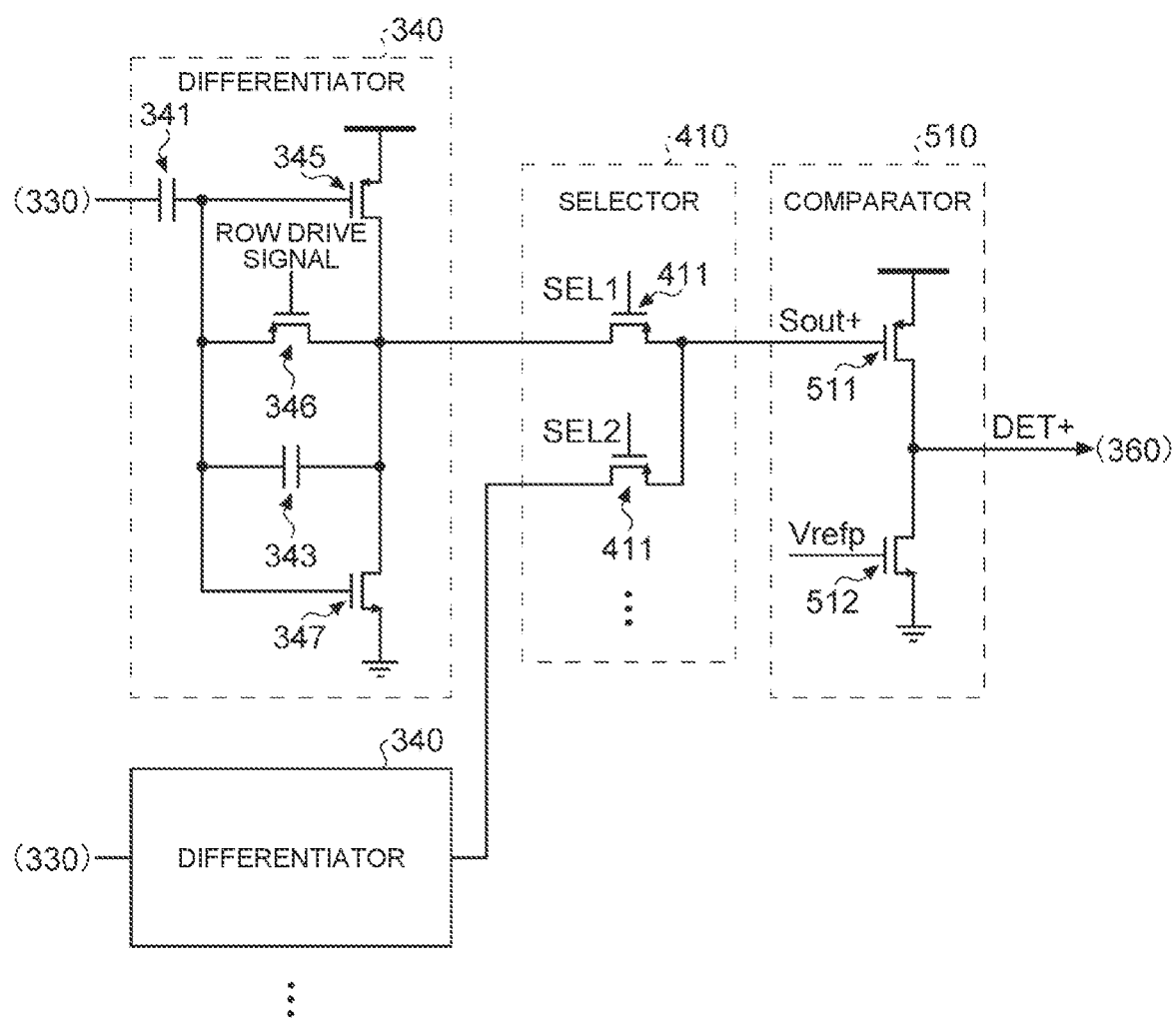
FIG. 11 is a circuit diagram depicting a configuration example of a differentiator, a selector, and a comparator according to the first embodiment.

FIG. 11 is a circuit diagram depicting a configuration example of the differentiator 340, the selector 410, and the comparator 510 in the detection block 320 according to the present embodiment.

The differentiator 340 includes capacitors 341 and 343, pMOS transistors 345 and 346, and an nMOS transistor 347. The pMOS transistor 345 and the nMOS transistor 347 are connected in series between a power supply terminal and a ground terminal with the pMOS transistor 345 as a power supply side. The capacitor 341 is inserted between the gates of the pMOS transistor 345/nMOS transistor 347 and the buffer 330. A connection point of the pMOS transistor 345 and the nMOS transistor 347 is connected to the selector 410. With this connection configuration, the pMOS transistor 345 and the nMOS transistor 347 function as the inverter 342.

In addition, the capacitor 341 and the pMOS transistor 345 are connected in parallel between the connection point connecting the pMOS transistor 346 with the nMOS transistor 347, and the capacitor 343. The pMOS transistor 346 functions as the switch 344.

Further, the selector 410 is provided with a plurality of pMOS transistors 411. The pMOS transistor 411 is arranged for each differentiator 340.

The pMOS transistor 411 is inserted between the corresponding differentiator 340 and the comparator 510. Further, a selection signal SEL is individually input to each of the gates of the pMOS transistor 411. The selection signal SEL of the m-th pMOS transistor 411 is referred to as SELm. By these selection signals SEL, the row drive circuit 251 can control to turn on one of the M pMOS transistors 411 and turn off the remaining others. In addition, the differential signal Sout+ is output to the comparator 510 as the selected signal through the pMOS transistor 411 in the on state. Note that the circuit configuration of the selector 420 is similar to that of the selector 410.

The comparator 510 includes a pMOS transistor 511 and an nMOS transistor 512. The pMOS transistor 511 and the nMOS transistor 512 are connected in series between the power supply terminal and the ground terminal. Further, the differential signal Sout+ is input to the gate of the pMOS transistor 511, while the voltage of the upper threshold Vrefp is input to the gate of the nMOS transistor 512. The detection signal DET+ is output from a connection point of the pMOS transistor 511 and the nMOS transistor 512. Note that the circuit configuration of the comparator 520 is similar to that of the comparator 510.

Note that the circuit configurations of the differentiator 340, the selector 410, and the comparator 510 are not limited to an example depicted in FIG. 11 as long as they have the functions described with reference to FIG. 8. For example, the nMOS transistor and the pMOS transistor are interchangeable.

1.5 Control Example of Row Drive Circuit

Figure 12:
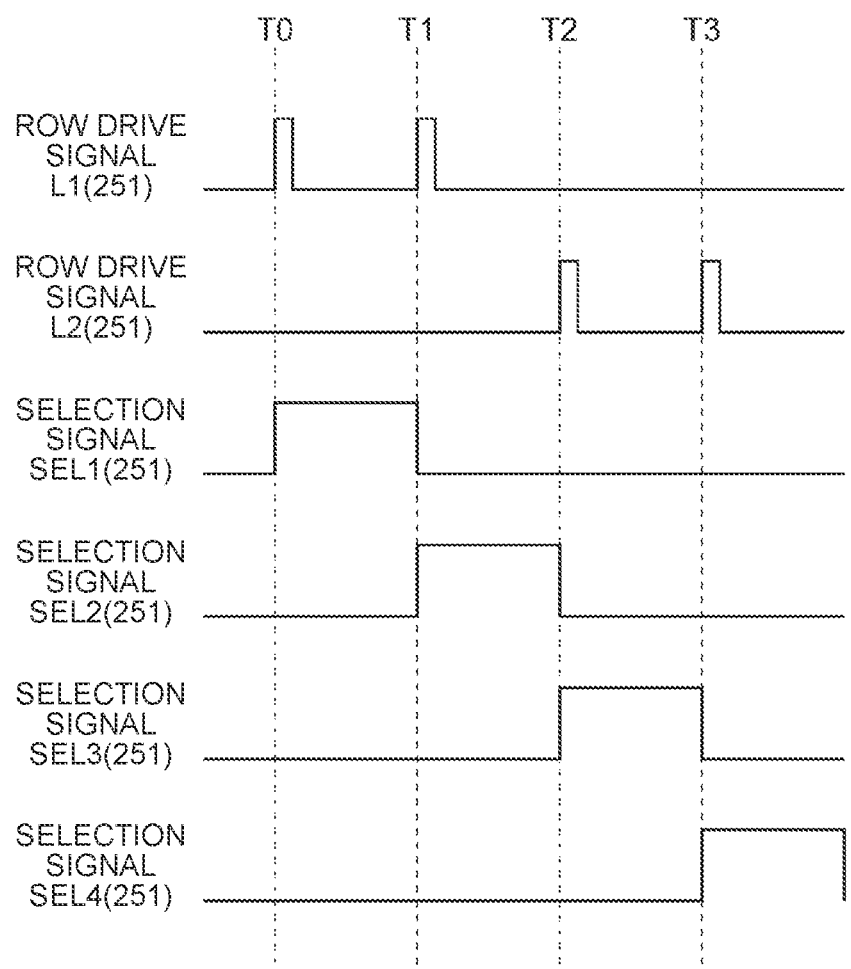
FIG. 12 is a timing chart depicting an example of control of the row drive circuit according to the first embodiment.

FIG. 12 is a timing chart depicting an example of control of the row drive circuit 251 according to the present embodiment. At timing T0, the row drive circuit 251 selects the first row by a row drive signal L1 and drives the differentiator 340 of the selected row. The row drive signal L1 initializes the capacitor 343 in the differentiator 340 in the first row. In addition, the row drive circuit 251 selects the upper left of the 2 row×2 column pattern in the shared block 221 over a certain period of time by a selection signal SEL1, and drives the selecting section 400. With this drive, the presence or absence of the address event is detected in the odd-numbered columns of the first row.

Next, at timing T1, the row drive circuit 251 drives the differentiator 340 in the first row again by the row drive signal L1. In addition, the row drive circuit 251 selects the upper right of the 2 row×2 column pattern in the shared block 221 over a certain period of time by a selection signal SEL2. Accordingly, the presence or absence of an address event is detected in the even-numbered columns of the first row.

At timing T2, the row drive circuit 251 drives the differentiator 340 in the second row by the row drive signal L2. The row drive signal L2 initializes the capacitor 343 in the differentiator 340 in the second row. In addition, the row drive circuit 251 selects the lower left of the 2 row×2 column pattern in the shared block 221 over a certain period of time by the selection signal SEL3. With this drive, the presence or absence of the address event is detected in the odd-numbered columns of the second row.

Subsequently, at timing T3, the row drive circuit 251 drives the differentiator 340 in the second row again by the row drive signal L2. In addition, the row drive circuit 251 selects the lower right of the 2 row×2 column pattern in the shared block 221 over a certain period of time by a selection signal SEL4. Accordingly, the presence or absence of an address event is detected in the even-numbered columns of the second row.

Thereafter, similarly, the row drive circuit 251 sequentially selects the row in which the logarithmic response section 310 is arranged, and drives the selected row by the row drive signal. In addition, each time a row is selected, the row drive circuit 251 sequentially selects each of the detection pixels 300 in the shared block 221 of the selected row by a selection signal. For example, in a case where the detection pixels 300 of a 2 row×2 column pattern are arranged in the shared block 221, each time a row is selected, an odd-numbered column and an even-numbered column in the row are sequentially selected.

Note that the row drive circuit 251 can also sequentially select a row (in other words, two rows having the logarithmic response section 310) in which the shared block 221 is arranged. In this case, every time a row is selected, four detection pixels in the shared block 221 of the row are sequentially selected.

1.6 Configuration Example of Detection Pixel and Detection Circuit

Figure 13:
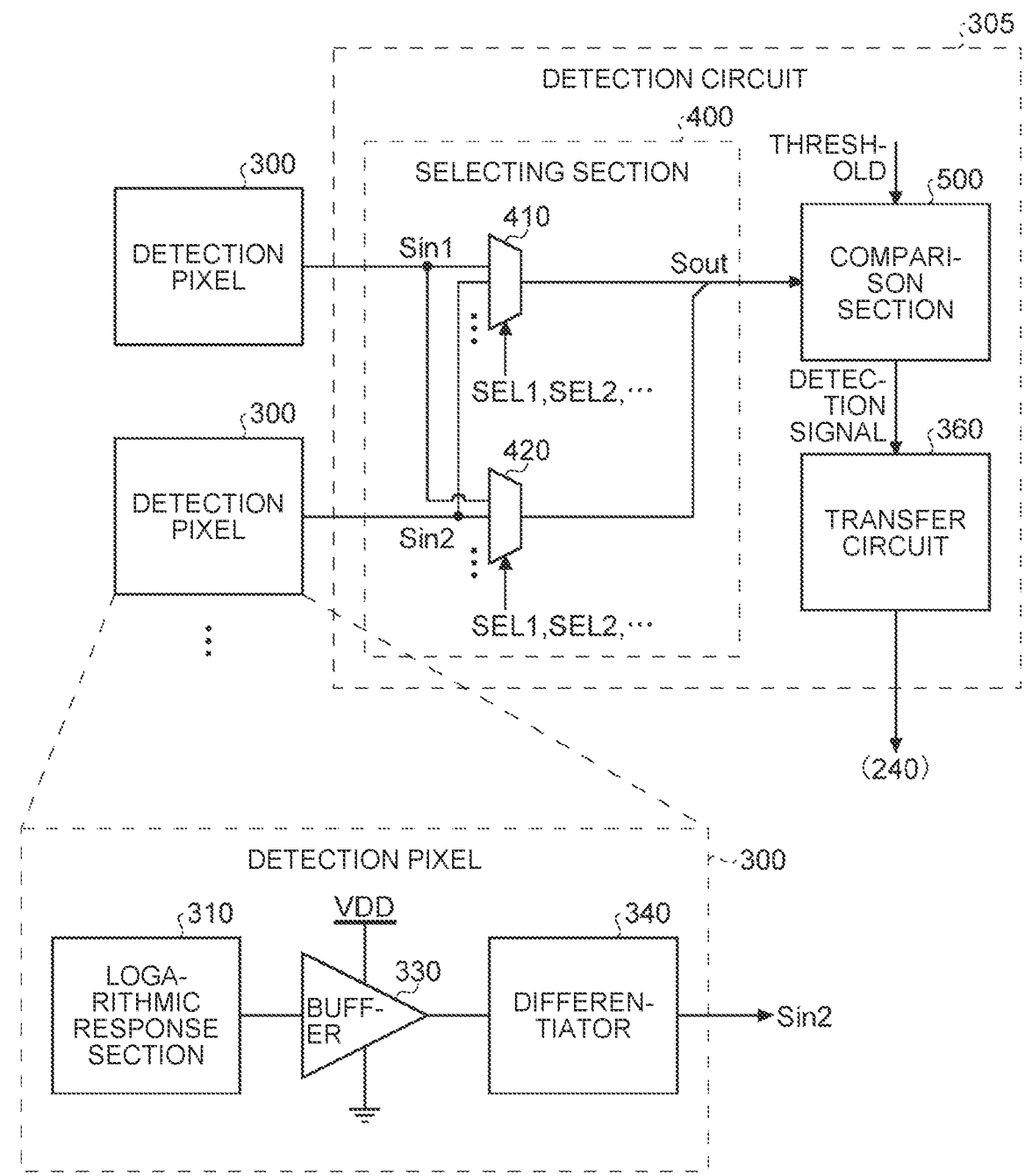
FIG. 13 is a block diagram depicting a configuration example of a detection pixel and a detection circuit according to the first embodiment.

FIG. 13 is a block diagram depicting a configuration example of the detection pixel 300 and a detection circuit 305 according to the present embodiment. Among the detection blocks 320 shared by the plurality of logarithmic response sections 310 in the shared block 221, a circuit including the selecting section 400, the comparison section 500, and the transfer circuit 360 is defined as the detection circuit 305. Further, a circuit including the logarithmic response section 310, the buffer 330, and the differentiator 340 is defined as the detection pixel 300. As depicted in the drawing, the detection circuit 305 is shared by a plurality of the detection pixels 300.

Each of the plurality of detection pixels 300 sharing the detection circuit 305 generates a voltage signal corresponding to the logarithmic value of the photocurrent. Subsequently, each of the detection pixels 300 outputs a differential signal Sin indicating a change amount of the voltage signal to the detection circuit 305 according to the row drive signal. In each of the detection pixels 300, a voltage signal corresponding to a logarithmic value is generated by the logarithmic response section 310, while a differential signal is generated by the differentiator 340.

Selection signals such as selection signals SEL1 and SEL2 are commonly input to the selectors 410 and 420 in the detection circuit 305. The detection circuit 305 selects a differential signal (that is, the change amount) of the detection pixel indicated by the selection signal among the plurality of detection pixels 300, and detects whether the change amount exceeds a predetermined threshold. The detection circuit 305 then transfers the detection signal to the signal processing circuit 240 according to the column drive signal. In the detection circuit 305, the differential signal is selected by the selecting section 400, and the comparison with the threshold is performed by the comparison section 500. In addition, the detection signal is transferred by the transfer circuit 360.

Here, in a typical DVS, the comparison section 500 and the transfer circuit 360 are arranged for each detection pixel together with the logarithmic response section 310, the buffer 330, and the differentiator 340. In contrast, in the above-described configuration in which the detection circuit 305 including the comparison section 500 and the transfer circuit 360 is shared by the plurality of detection pixels 300, it is possible to reduce the circuit scale of the solid-state imaging device 200 as compared with a case where the detection circuit is not shared. This facilitates microfabrication of pixels.

When the stacked structure is adopted in particular, using a conventional configuration with no shared use of the detection circuit 305 would lead to the detection chip 202 having a larger circuit scale compared to the light receiving chip 201. With this configuration, the density of the pixels is limited by the circuit on the detection chip 202, making it difficult to achieve microfabrication of the pixels. However, by using a configuration in which the plurality of detection pixels 300 shares the detection circuit 305, it is possible to reduce the circuit scale of the detection chip 202, facilitating microfabrication of the pixels.

Although the buffer 330 is arranged for each detection pixel 300, the configuration is not limited to this configuration, and it is also possible to omit the buffer 330.

In addition, although the photoelectric conversion element 311 and the nMOS transistors 312 and 313 of the logarithmic response section 310 are arranged on the light receiving chip 201, and the pMOS transistors 314 and subsequent transistors are arranged on the detection chip 202, the configuration is not limited to this example. For example, the photoelectric conversion element 311 alone can be arranged on the light receiving chip 201, and the other devices can be arranged on the detection chip 202. Alternatively, the logarithmic response section 310 alone can be arranged on the light receiving chip 201, and the buffers 330 and the subsequent devices can be arranged on the detection chip 202. Still alternatively, the logarithmic response section 310 and the buffer 330 can be arranged on the light receiving chip 201, while the differentiator 340 and the subsequent devices can be arranged on the detection chip 202. In addition, the logarithmic response section 310, the buffer 330, and the differentiator 340 can be arranged on the light receiving chip 201, and the detection circuit 305 and the subsequent circuits can be arranged on the detection chip 202. Still alternatively, portions up to the selecting section 400 can be arranged on the light receiving chip 201, while the comparison section 500 and the subsequent components can be arranged on the detection chip 202.

1.6.1 Operation Example of Solid-State Imaging Device

Figure 14:
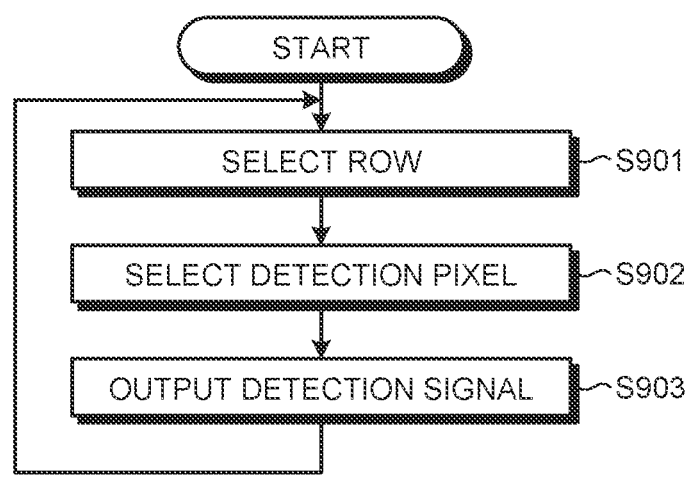
FIG. 14 is a flowchart depicting an example of operation of the solid-state imaging device according to the first embodiment.

FIG. 14 is a flowchart depicting an example of the operation of the solid-state imaging device 200 according to the present embodiment. The operation is started at a timing of execution of a predetermined application for detecting the presence or absence of an address event, for example.

The row drive circuit 251 selects one of the rows (step S901). The row drive circuit 251 selects and drives one of the detection pixels 300 in each shared block 221 in the selected row (step S902). The detection circuit 305 detects the presence or absence of an address event in the selected detection pixel 300 (step S903). After step S903, the solid-state imaging device 200 repeatedly executes step S901 and subsequent steps.

In this manner, the present embodiment has a configuration in which the detection circuit 305 that detects the presence or absence of the address event is shared by the plurality of detection pixels 300, making it possible to reduce the circuit scale as compared with the case where the detection circuit 305 is not shared. This facilitates microfabrication of the detection pixel 300.

1.7 Modification of Detection Pixel and Detection Circuit

In the first embodiment described above, the solid-state imaging device 200 selects the detection pixels 300 one by one, and simultaneously detects an on-event and an off-event for the detection pixels. Alternatively, the solid-state imaging device 200 can also select two detection pixels, detect an on-event for one of the detection pixels, and detect an off-event for the other detection pixel. The solid-state imaging device 200 according to a modification of the first embodiment is different from that of the first embodiment in that an on-event is detected for one of two detection pixels and an off-event is detected for the other detection pixel.

Figure 15:
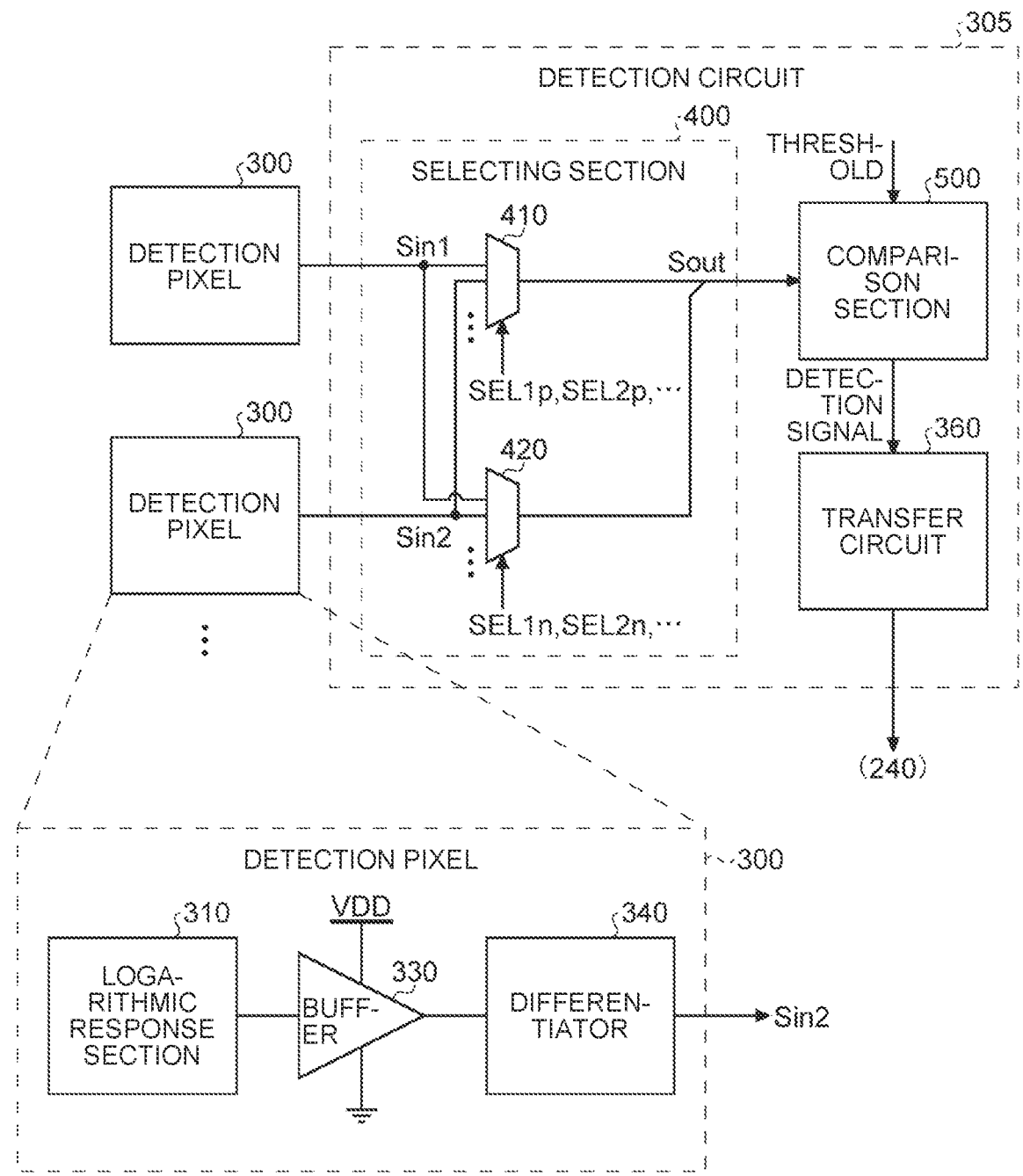
FIG. 15 is a block diagram depicting a configuration example of a detection pixel and a detection circuit according to a modification of the first embodiment of the present technology.

FIG. 15 is a block diagram depicting a configuration example of the detection pixel 300 and the detection circuit 305 according to the modification of the present embodiment. The detection circuit 305 according to the modification of the first embodiment is different from that of the first embodiment in that a selection signal such as a selection signal SEL1p or SEL2p is input to the selector 410 while a selection signal such as a selection signal SEL1n or SEL2n is input to the selector 420. In the modification of the first embodiment, two detection pixels 300 are selected, and the selector 410 selects one differential signal according to a selection signal SEL1p, SEL2p, or the like. At the same time, the selector 420 selects the other differential signal according to the selection signal SEL1n, SEL2n, or the like.

1.7.1 Control Example of Row Drive Circuit According to Modification

Figure 16:
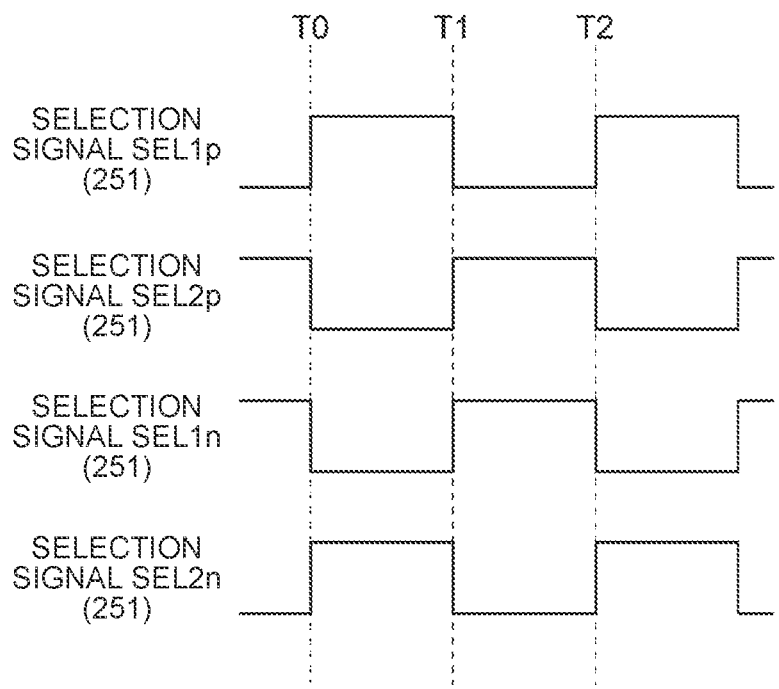
FIG. 16 is a timing chart depicting an example of control of a row drive circuit in the modification of the first embodiment of the present technology.

FIG. 16 is a timing chart depicting an example of control of the row drive circuit 251 in the modification of the present embodiment. At the timings T0 to T2, it is assumed that two pixels are selected, that is, the detection pixel 300 that outputs a differential signal Sin1 and the detection pixel 300 that outputs a differential signal Sin2. At timings T0 to T1, the row drive circuit 251 sets the selection signals SEL1p and SEL2n to the high level and sets the selection signals SEL2p and SEL1n to the low level. With this setting, an on-event is detected for the pixel corresponding to the differential signal Sin1, and an off-event is detected for the pixel corresponding to the differential signal Sin2.

Next, at timings T1 to T2, the row drive circuit 251 sets the selection signals SEL1p and SEL2n to the low level and sets the selection signals SEL2p and SEL1n to the high level. With this setting, an on-event is detected for the pixel corresponding to the differential signal Sin2, and an off-event is detected for the pixel corresponding to the differential signal Sin1.

In this manner, according to the modification of the present embodiment, since the on-event is detected for one of the two detection pixels and the off-event is detected for the other detection pixel, it is possible to detect the on-event and the off-event spatially in parallel at the same time.

1.8 Configuration Example of Shared Block

Next, a more specific configuration example of each shared block 221 in the above description will be described in detail below with reference to the drawings. The following description uses, as the logarithmic response section 310, a gain boost type logarithmic response section 310A depicted in FIG. 7, as an example. However, the configuration is not limited to this example, and it is allowable to use various circuits that generate a voltage signal according to the logarithmic value of the photocurrent, such as the source follower type logarithmic response section 310 depicted in FIG. 6, for example. Further, the following description uses an exemplary case where one shared block 221 includes a total of four logarithmic response sections 310A in a 2 row×2 column pattern. However, the configuration is not limited to this example, and each shared block 221 may include one or two or more logarithmic response sections 310A.

Figure 17:
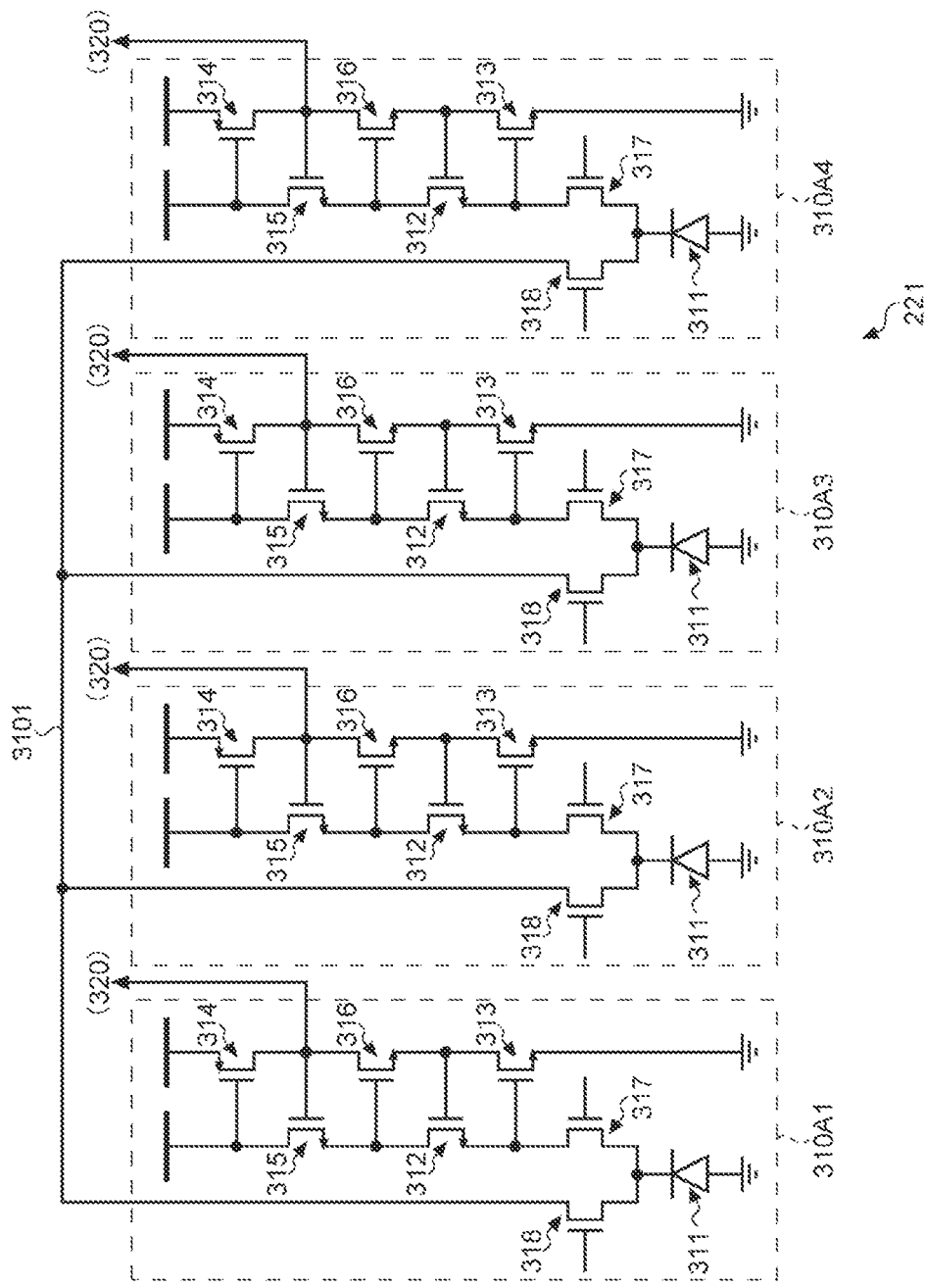
FIG. 17 is a circuit diagram depicting a schematic configuration example of a shared block according to the first embodiment.

FIG. 17 is a circuit diagram depicting a schematic configuration example of a shared block according to the present embodiment. As depicted in FIG. 17, each shared block 221 includes four logarithmic response sections 310A1 to 310A4. Each of the logarithmic response sections 310A1 to 310A4 (hereinafter, referred to as the logarithmic response section 310An when logarithmic response sections 310A1 to 310A4 are not distinguished from each other) has a configuration in which two switching transistors 317 and 318 have been added to the basic configuration of the logarithmic response section 310A depicted in FIG. 6. Each of the two switching transistors 317 and 318 may be either an nMOS transistor or a pMOS transistor. For example, the switching transistor 317 may be an example of a first transistor in the claims, and the switching transistor 318 may be an example of a second transistor in the claims.

The switching transistor 317 is connected, for example, between the cathode of the photoelectric conversion element 311, the drain of the nMOS transistor 312, and the gate of the nMOS transistor 313, and controls the inflow of the photocurrent flowing from the photoelectric conversion element 311 into the logarithmic conversion circuit.

The switching transistor 318 is connected, for example, between the cathode of the photoelectric conversion element 311 and a common line 3101. The common line 3101 is connected with cathodes of the photoelectric conversion elements 311 in all the logarithmic response sections 310An included in the same shared block 221, through the switching transistor 318. For example, the common line 3101 may be an example of a first common line in the claims.

In the above configuration, by turning on the switching transistors 318 in two or more logarithmic response sections 310An among the logarithmic response sections 310An included in one shared block 221, turning on the switching transistors 317 of one logarithmic response section 310An (referred to as a logarithmic response section 310A1) among the two or more logarithmic response sections 310An, and turning off the switching transistors 317 of the other logarithmic response sections 310An, it is possible to allow the photocurrent flowing out of the photoelectric conversion element 311 of the logarithmic response section 310A1 and the photocurrent flowing out of the photoelectric conversion element 311 of the logarithmic response section 310An in which the switching transistor 317 has been turned off to intensively flow into the logarithmic conversion circuit of the logarithmic response section 310A1. That is, it is possible to collect the photocurrent flowing out of the photoelectric conversion element 311 of the logarithmic response section 310An in which the switching transistor 317 is turned off and the switching transistor 318 is turned on into the logarithmic conversion circuit of the logarithmic response section 310An in which both the switching transistors 317 and 318 are turned on.

In this manner, by adopting a configuration in which the photocurrents flowing out from the plurality of photoelectric conversion elements 311 can be aggregated into one logarithmic conversion circuit, it is possible to obtain a larger photocurrent amount, leading to expansion of the dynamic range in photocurrent detection. This makes it possible to obtain a sufficiently wide dynamic range even under the condition such as low illuminance.

On the other hand, in a case where sufficient illuminance can be obtained, by turning off the switching transistor 318 and turning on the switching transistor 317 in all or a necessary and sufficient number of logarithmic response sections 310An, it is possible to allow all or the necessary and sufficient number of logarithmic response sections 310An to operate as one address event detection pixel, leading to achievement of detection of an address event at high resolution, reduction of operating power, and the like.

1.9 Layout Example of Shared Block

Figure 18:
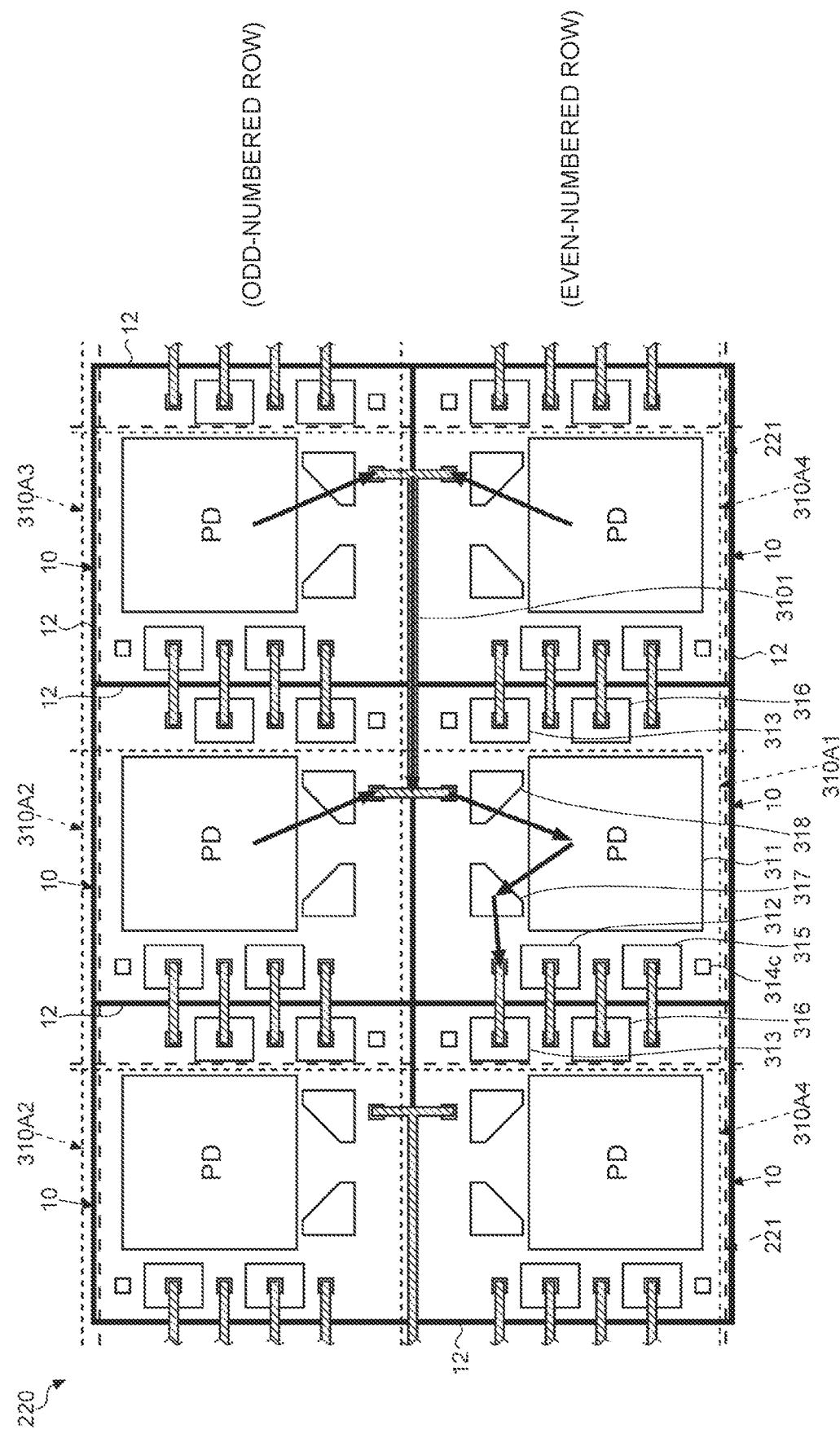
FIG. 18 is a plan view depicting a layout example of a shared block according to the first embodiment.

Next, a layout example of the shared block 221 depicted in FIG. 17 will be described. FIG. 18 is a plan view depicting a layout example of the shared block according to the present embodiment. For convenience of explanation, FIG. 18 depicts a schematic layout example on the element formation surface side of a semiconductor substrate on which the photoelectric conversion element 311 is formed and a schematic layout example of a part of a wiring layer formed on the element formation surface of the substrate. Further, for the sake of clarity, FIG. 18 depicts an arrangement of the nMOS transistors 312, 313, 315, and 316 and the switching transistors 317 and 318 by the position of the gate electrode. FIG. 18 further depicts, by a thick arrow, an outline of a current path formed in a binning mode to be described below.

Here, in the present embodiment, there are at least two definitions of one pixel. In one definition, a pixel is a pixel on a layout formed in a repeated pattern in the design of the light receiving section 220, and in the other definition, a pixel is a pixel on a circuit that operates as one detection pixel 300. Each pixel on the circuit includes one logarithmic response section 310An. In the following description, a pixel on a layout is referred to as a layout pixel, and a pixel on a circuit is referred to as a circuit pixel. Further, since the configuration of the detection pixel 300 arranged in the light receiving section 220 is all or a part of the logarithmic response section 310An, here, the logarithmic response section 310An will be described as a circuit pixel.

(Layout Pixel)

As depicted in FIG. 18, a pixel area in which one layout pixel 10 is arranged in the light receiving chip 201 is partitioned by a pixel isolation section 12 extending in the row direction and the column direction. Each layout pixel 10 includes: a photoelectric conversion element 311 arranged substantially at the center; a plurality of nMOS transistors 312, 313, 315, and 316 arranged along the outer peripheral portion of the pixel area, in other words, arranged so as to surround the photoelectric conversion element 311 from at least two directions (three directions in FIG. 18); switching transistors 317 and 318; and a contact 314c for forming a connection with the pMOS transistor 314 arranged on the detection chip 202 side.

In the layout example depicted in FIG. 18, for example, in each logarithmic response section 310An depicted in FIG. 17, the nMOS transistors 312 and 315 in the left column are arranged on the left side of the photoelectric conversion element 311, and the nMOS transistors 313 and 316 in the right column are arranged on the right side of the photoelectric conversion element 311. Further, the two switching transistors 317 and 318 are disposed on the upper or lower side of the photoelectric conversion element 311, for example. In this manner, by adopting a highly symmetric layout in which the photoelectric conversion element 311 is sandwiched between two nMOS transistors, it is possible to increase process accuracy and yield at the time of manufacturing.

Further, for example, the two switching transistors 317 and 318 are arranged on the lower side of the photoelectric conversion element 311 in the odd-numbered rows, and are arranged on the upper side of the photoelectric conversion element 311 in the even-numbered rows. That is, the layout pixels 10 in the even-numbered rows have a layout obtained by vertically inverting the layout pixels 10 in the odd-numbered rows. By adopting such a layout, the pattern of one layout pixel 10 can be used for all the layout pixels 10, making it possible to facilitate layout design of the light receiving section 220.

Further, by arranging the layout pixel 10 in a layout in which the odd-numbered row and the even-numbered row are vertically inverted, the switching transistors 317 and 318 of the logarithmic response section 310An constituting one shared block 221 can be brought close to each other, making it also possible to achieve facilitation of layout design of the common line 3101, reduction of the wiring length of the common line 3101, and the like.

(Circuit Pixel)

On the other hand, on the circuit, the photoelectric conversion element 311 in a certain layout pixel 10, the two nMOS transistors 312 and 315 arranged on the left side of the photoelectric conversion element 311, and the two nMOS transistors 313 and 316 arranged on the right side of the photoelectric conversion element 311 in the layout pixel 10 adjacent to the layout pixel 10 on the left side constitute one circuit pixel (here, the logarithmic response section 310An). That is, in the circuit pixel (here, the logarithmic response section 310An) on the layout, the logarithmic conversion circuit including the four nMOS transistors 312, 313, 315, and 316 is configured to be arranged across the pixel isolation section 12.

With this configuration of the logarithmic conversion circuit in one logarithmic response section 310An between the adjacent layout pixels 10 in this manner, it is possible to reduce the wiring length of the logarithmic conversion circuit, that is, the wiring length connecting the nMOS transistors 312, 313, 315, and 316 constituting the logarithmic conversion circuit, while maintaining the symmetry of the layout pixel 10. This makes it possible to reduce the time constant formed by the wiring constituting the logarithmic conversion circuit, leading to improved response speed of the logarithmic conversion circuit.

1.10 Operation Example

Next, an operation example of the imaging device 100 according to the present embodiment will be described. As described above, in the present embodiment, by controlling on/off of the switching transistors 317 and 318, it is possible to switch between two modes, namely, a mode (hereinafter, referred to as a high-resolution mode) in which one logarithmic response section 310 (which may be the logarithmic response section 310A) operates as one pixel and a mode (hereinafter, referred to as a binning mode) in which two or more logarithmic response sections 310 in the shared block 221 operate as one pixel. In addition, it is also possible to realize a mode (hereinafter, referred to as a ROI mode) in which some of the shared blocks 221 are driven in the high-resolution mode and the remaining shared blocks 221 are driven in the binning mode. For example, the binning mode and the ROI mode may be an example of a first mode in the claims, and the high-resolution mode may be an example of a second mode in the claims. The binning mode may be an example of a third mode in the claims, and the ROI mode may be an example of a fourth mode in the claims.

1.10.1 Timing Chart

Figure 19:
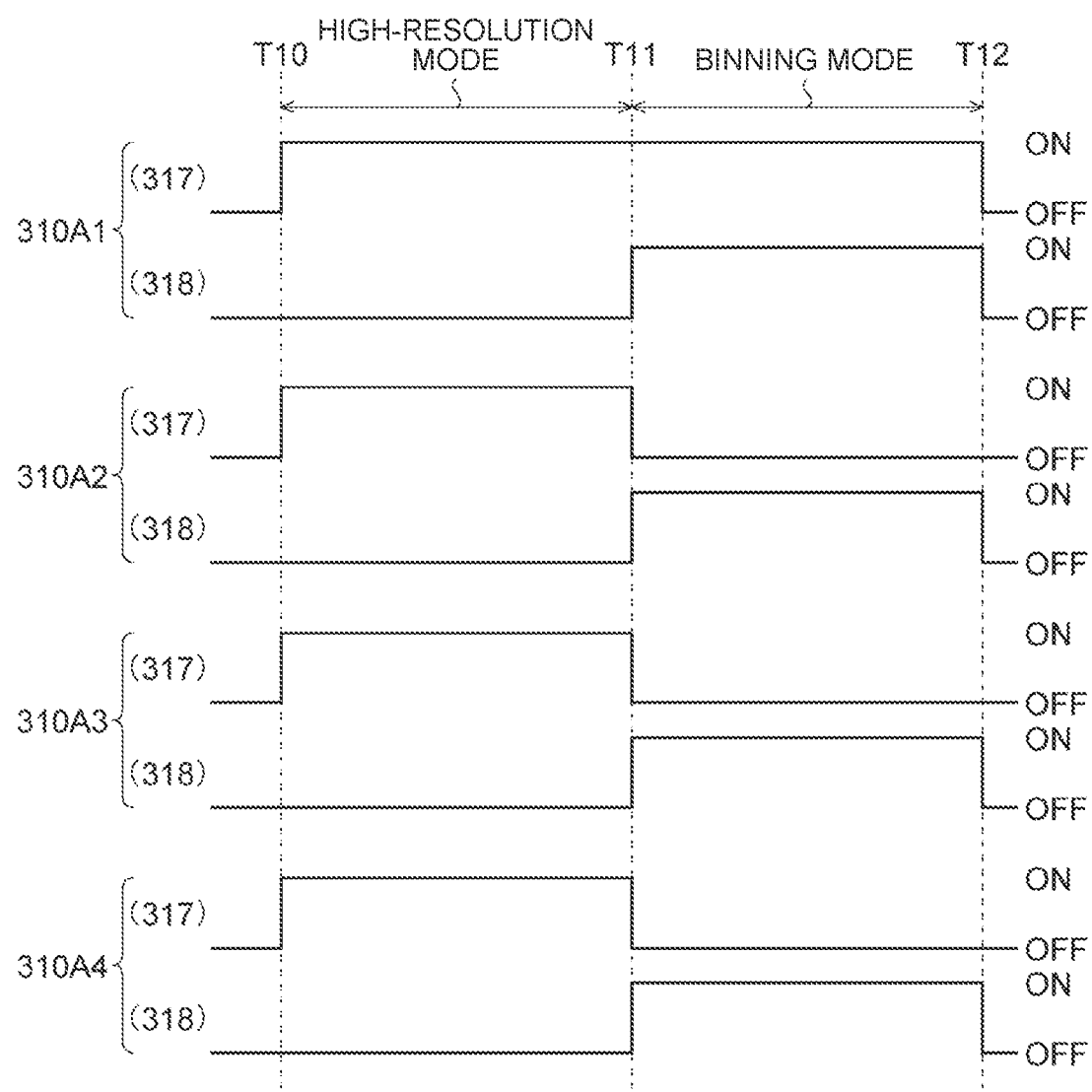
FIG. 19 is a timing chart depicting exemplary control of switching transistors in a high-resolution mode and a binning mode according to the first embodiment.

FIG. 19 is a timing chart depicting exemplary control of the switching transistors in the high-resolution mode and the binning mode according to the present embodiment. As depicted in FIG. 19, in the high-resolution mode depicted in sections T10 to T11, in each logarithmic response sections 310A1 to 310A4, the switching transistor 317 is turned on, and the switching transistor 318 is turned off. This leads to formation of a current path through which the photocurrent flowing out of the photoelectric conversion element 311 of each logarithmic response sections 310A1 to 310A4 flows into their own logarithmic conversion circuits.

In contrast, in the binning mode depicted in the sections T11 to T12, both the switching transistors 317 and 318 of the logarithmic response section 310A1 are turned on. On the other hand, in the logarithmic response sections 310A2 to 310A4, the switching transistor 317 is turned off while the switching transistor 318 is turned on. This leads to formation of a current path through which the photocurrent flowing out of the photoelectric conversion element 311 of each logarithmic response sections 310A1 to 310A4 flows into the logarithmic conversion circuit of the logarithmic response section 310A1.

1.10.2 Flowchart

Figure 20:
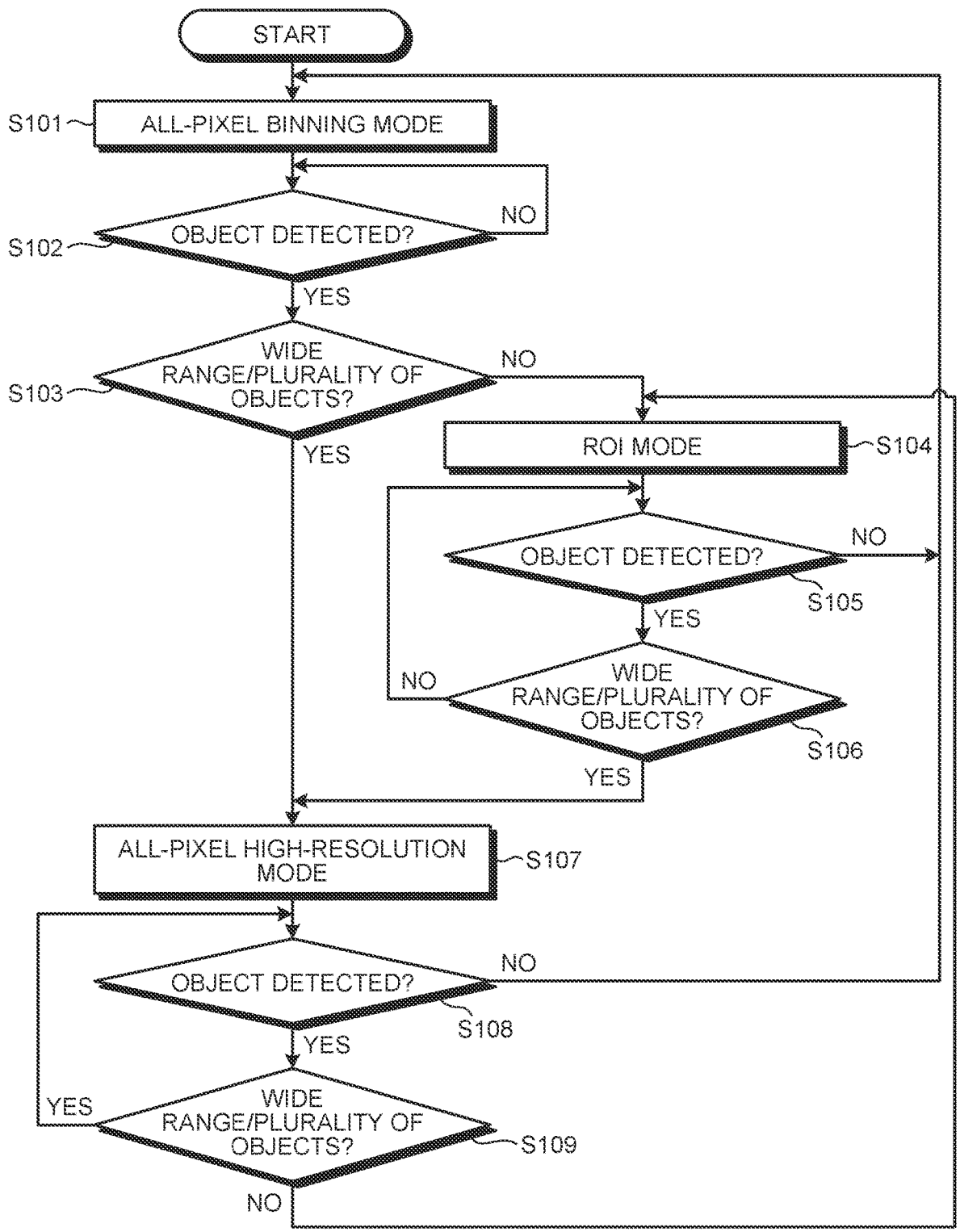
FIG. 20 is a flowchart depicting an operation example of the imaging device according to the first embodiment.

Next, an operation example of the imaging device 100 will be described. FIG. 20 is a flowchart depicting an operation example of the imaging device according to the present embodiment, depicting an operation example of switching between a mode (hereinafter, referred to as an all-pixel binning mode) in which all pixels operate in a binning mode, a mode (hereinafter, referred to as an all-pixel high-resolution mode) in which all pixels operate in a high-resolution mode, and the ROI mode. The present description will describe an exemplary case where the control section 130 (refer to FIG. 1) in the imaging device 100 controls the operation mode of the solid-state imaging device 200. However, control of the operation mode is not limited to this example and the signal processing circuit 240 in the solid-state imaging device 200 may be configured to control the operation mode. Further, the operation depicted in FIG. 20 may be terminated by, for example, an interruption operation or the like with respect to the control section 130 or the solid-state imaging device 200.

As depicted in FIG. 20, in the present operation, after activation, the control section 130 sets the operation mode of the solid-state imaging device 200 to the all-pixel binning mode, for example (step S101). In the all-pixel binning mode, as described above, all the shared blocks 221 of the light receiving section 220 are driven in the binning mode. In this case, for example, in the example depicted in FIG. 17, the switching transistors 317 of all the logarithmic response sections 310A1 to 310A4 in each shared block 221 are turned on, the switching transistor 318 of the logarithmic response section 310A1 is turned on, and the switching transistors 318 of the logarithmic response sections 310A2 to 310A4 are turned off. This leads to formation of a current path through which the photocurrent flowing out of the photoelectric conversion element 311 of all the logarithmic response sections 310A1 to 310A4 flows into the logarithmic conversion circuit of the logarithmic response section 310A1.

Next, the control section 130 determines whether an object has been detected in the all-pixel binning mode (step S102), and continues the all-pixel binning mode until the object is detected (NO in step S102). The object detection determination may be executed, for example, on the basis of a condition such as whether an address event (on-event and/or off-event) has been detected in any shared block, or whether a region where the address event has been detected has an area or a number of pixels of a certain degree (for example, a preset threshold or more).

Detection of an object does not need to be determined in one frame, and may be determined in several consecutive frames. Note that one frame may be, for example, image data including address information (which may include a timestamp) of a pixel on which an address event has been detected within a predetermined period of time. Further, the detection of the object may be executed by processing such as object recognition on the image data.

When an object has been detected (YES in step S102), the control section 130 determines, for example, whether the detected object is a wide range object, whether the detected object is a plurality of objects, or the like (step S103). Note that the wide range may be, for example, a range that occupies a preset ratio (for example, 20% of the area or the number of pixels, or the like) or more with respect to the light receiving section 220.

When the detected object is not a wide range object (NO in step S103), the control section 130 sets the operation mode of the solid-state imaging device 200 to the ROI mode, for example (step S104). The ROI mode is a mode of driving some region including the region where the object is detected in the light receiving section 220 in the high-resolution mode, and driving the other region in the binning mode, for example.

Next, the control section 130 determines whether an object has been detected (step S105). When no object has been detected (NO in step S105), the control section 130 returns the process to step S101 to restart setting the all-pixel binning mode to the solid-state imaging device 200. When an object has been detected (YES in step S105), the control section 130 determines, for example, whether the detected object is a wide range object, whether the detected object is a plurality of objects, or the like, similarly to step S103 (step S106). When the detected object is not a wide range object (NO in step S106), the control section 130 returns the process to step S105 to continue the ROI mode.

When a wide range object has been detected in step S103 or step S106 (YES in step S103/S106), the control section 130 sets the operation mode of the solid-state imaging device 200 to the all-pixel high-resolution mode, for example (step S107). As described above, the all-pixel high-resolution mode is a mode in which all the shared blocks 221 of the light receiving section 220 are driven in the high-resolution mode. In this case, in the example depicted in FIG. 17, the switching transistors 317 of all the logarithmic response sections 310A1 to 310A4 in each shared block 221 are turned off, and the switching transistors 318 are turned on, for example. This leads to formation of an individual current path through which the photocurrent flowing out of the photoelectric conversion element 311 of each logarithmic response sections 310A1 to 310A4 flows into their own logarithmic conversion circuits.

Next, the control section 130 determines whether an object has been detected (step S108). When no object has been detected (NO in step S108), the control section 130 returns the process to step S101 to restart setting the all-pixel binning mode to the solid-state imaging device 200. When an object has been detected (YES in step S108), the control section 130 determines, for example, whether the detected object is a wide range object, whether the detected object is a plurality of objects, or the like, similarly to step S103 (step S109). When the detected object is a wide range object (YES in step S109), the control section 130 returns the process to step S108 to continue the all-pixel high-resolution mode. In contrast, when the detected object is not a wide range object or a plurality of objects (NO in step S109), the control section 130 proceeds to step S104, sets the operation mode of the solid-state imaging device 200 to the ROI mode and executes subsequent operations.

1.11 Action and Effects

As described above, according to the present embodiment, with a configuration in which the photocurrent flowing out from the plurality of photoelectric conversion elements 311 can be aggregated into one logarithmic conversion circuit, it is possible to obtain a larger photocurrent amount, enabling expansion of the dynamic range in photocurrent detection. This makes it possible to obtain a sufficiently wide dynamic range even under the condition such as low illuminance.

On the other hand, in a case where sufficient illuminance can be obtained, by turning off the switching transistor 318 and turning on the switching transistor 317 in all or a necessary and sufficient number of logarithmic response sections 310An, it is possible to allow all or the necessary and sufficient number of logarithmic response sections 310An to operate as one address event detection pixel, leading to achievement of detection of an address event at high resolution, reduction of operating power, and the like.

Further, in the binning mode, constantly turning on the switching transistor 318 of the shared logarithmic response section 310An (for example, all logarithmic response sections 310An in the shared block 221) will allow constant formation of a current path from each logarithmic response sections 310A2 to 310An to the logarithmic conversion circuit of the logarithmic response section 310A1. This makes it possible to share one logarithmic conversion circuit by the plurality of detection pixels 300 without including a charge storage section such as a floating diffusion region, like a case of a CMOS image sensor.

2. Second Embodiment

Next, a second embodiment will be described in detail with reference to the drawings. In the present embodiment, another configuration of the shared block 221 described with reference to FIG. 17 in the first embodiment will be described with an example.

In the first embodiment, as described with reference to FIGS. 17 and 18, the photocurrent, which has flowed out of the photoelectric conversion element 311 of the logarithmic response sections 310A2 to 310A4 in which the switching transistor 318 is turned off in the binning mode, flows through the common line 3101, then through the switching transistor 317 of the logarithmic response section 310A1, the cathode of the photoelectric conversion element 311 and through the switching transistor 318, so as to flow into the logarithmic conversion circuit of the logarithmic response section 310A1. Therefore, it is necessary, in the first embodiment, to implement potential design ranging from the switching transistor 317 of the logarithmic response section 310A1 through the cathode of the photoelectric conversion element 311 up to the switching transistor 318 so that the photocurrent flowing out of the photoelectric conversion elements 311 of the logarithmic response sections 310A2 to 310A4 smoothly flows into the logarithmic conversion circuit of the logarithmic response section 310A1. Accordingly, in the second embodiment, a shared block capable of greatly relaxing the restriction on the potential design will be described with an example.

The configurations and operations of the imaging device and the solid-state imaging device according to the present embodiment may be similar to the configurations and operations of the imaging device 100 and the solid-state imaging device 200 according to the first embodiment described above, and thus, detailed description will be omitted here. However, in the present embodiment, the shared block 221 according to the first embodiment is replaced with a shared block 621 to be described below.

2.1 Configuration Example of Shared Block

Figure 21:
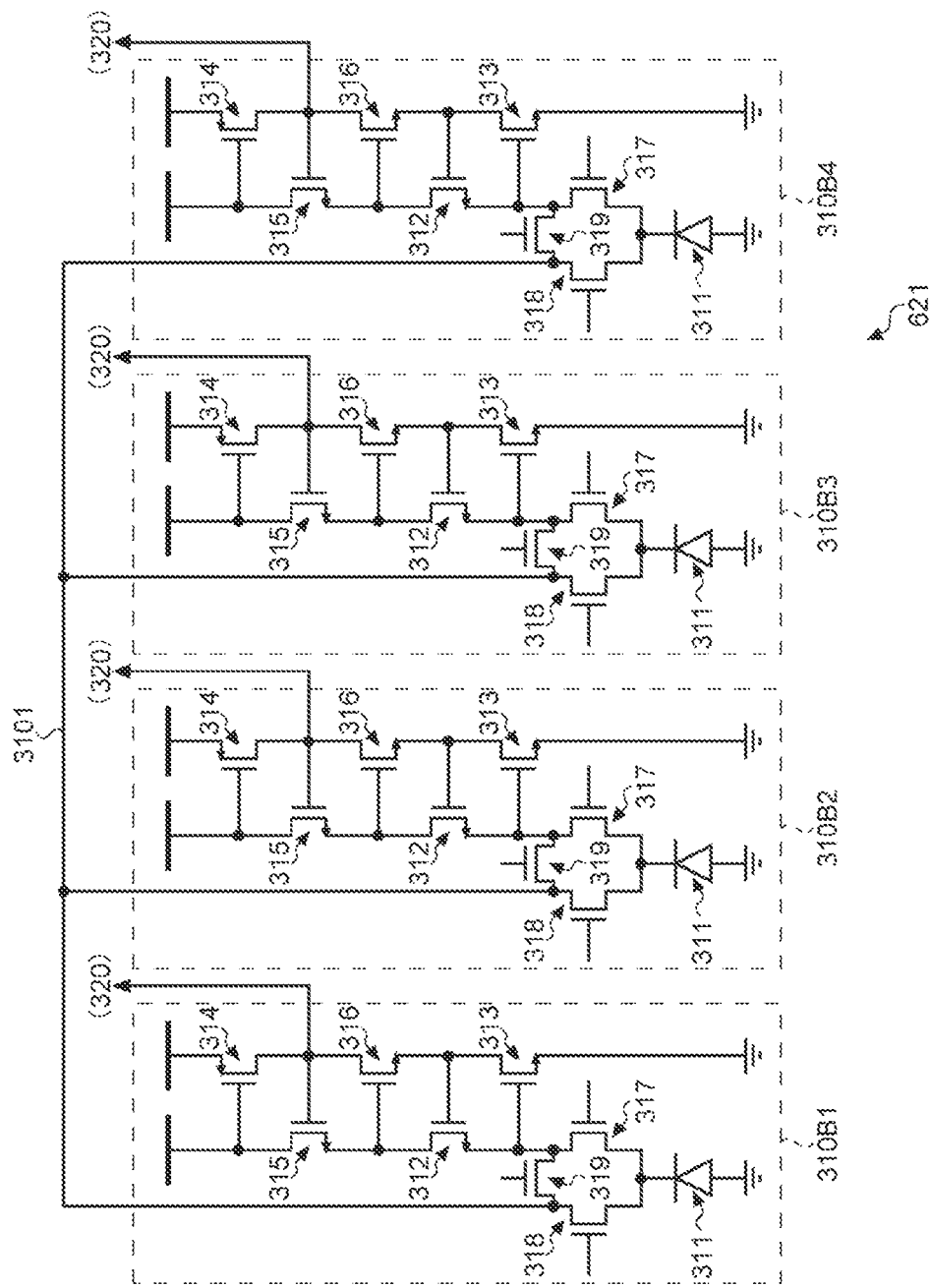
FIG. 21 is a circuit diagram depicting a schematic configuration example of a shared block according to a second embodiment.

FIG. 21 is a circuit diagram depicting a schematic configuration example of the shared block according to the present embodiment. A logarithmic response section 310Bn exemplified below is an example of a logarithmic response section based on the gain boost type logarithmic response section 310A exemplified in FIG. 7. However, the configuration is not limited thereto, and it is also allowable, for example, to have a logarithmic response section 310B based on various circuits that generate voltage signals corresponding to logarithmic values of photocurrent, such as the source follower type logarithmic response section 310 exemplified in FIG. 6. Further, the following description uses an exemplary case where one shared block 621 includes a total of four logarithmic response sections 310Bn in a 2 row×2 column pattern. However, the configuration is not limited to this example, and each shared block 621 may include one or two or more logarithmic response sections 310Bn.

As depicted in FIG. 21, logarithmic response sections 310B1 to 310B4 according to the present embodiment (in the present description, represented by using the reference numeral 310Bn when the logarithmic response sections 310B1 to 310B4 are not distinguished from each other) each have a configuration in which a switching transistor 319 is further added to a configuration similar to the logarithmic response section 310An described with reference to FIG. 17 in the first embodiment. The switching transistor 319 has the source connected to, for example, the drain of the switching transistor 318, and has the drain connected to the drain of the switching transistor 317, the source of the nMOS transistor 312, and the gate of the nMOS transistor 313, for example. For example, the switching transistor 319 may be an example of a third transistor in the claims. Further, for example, a node connecting the drain of the switching transistor 317, the source of the nMOS transistor 312, and the gate of the nMOS transistor 313 to each other may be an example of a second node in the claims, while the drain of the switching transistor 318 may be an example of the second node in the claims.

2.2 Layout Example of Shared Block

Figure 22:
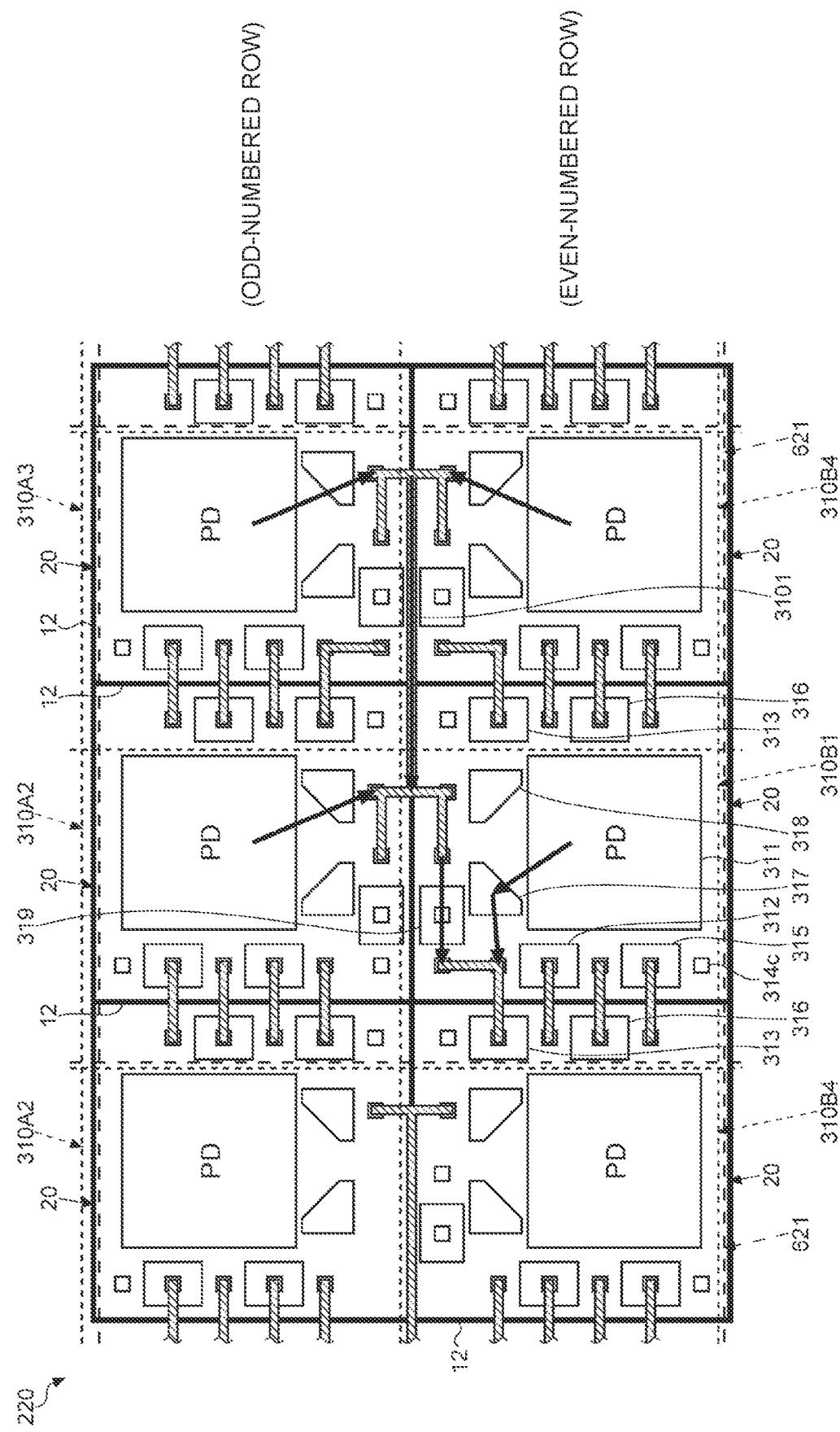
FIG. 22 is a plan view depicting a layout example of a shared block according to the second embodiment.

Next, a layout example of the shared block 621 depicted in FIG. 21 will be described. FIG. 22 is a plan view depicting a layout example of the shared block according to the present embodiment. For convenience of explanation, FIG. 22 depicts a schematic layout example on the element formation surface side of a semiconductor substrate on which the photoelectric conversion element 311 is formed and a schematic layout example of a part of a wiring layer formed on the element formation surface of the substrate. Further, for the sake of clarity, FIG. 22 depicts an arrangement of the nMOS transistors 312, 313, 315, and 316 and the switching transistors 317 to 319 by the position of the gate electrode. FIG. 22 further depicts, by a thick arrow, an outline of a current path formed in the binning mode to be described below. For example, the nMOS transistor 312 may be an example of a fourth transistor in the claims, the nMOS transistor 313 may be an example of a fifth transistor in the claims, the nMOS transistor 315 may be an example of a sixth transistor in the claims, and the nMOS transistor 316 may be an example of a seventh transistor in the claims.

As depicted in FIG. 22, each layout pixel 20 according to the present embodiment has a configuration in which a switching transistor 319 is added on the same side of the switching transistor 317 disposed with respect to the photoelectric conversion element 311, in a configuration similar to the layout pixel 10 described with reference to FIG. 18 in the first embodiment. By adopting such a layout, it is possible to reduce the wiring from the common line 3101 to the switching transistor 319.

2.3 Operation Example (Timing Chart)

Figure 23:
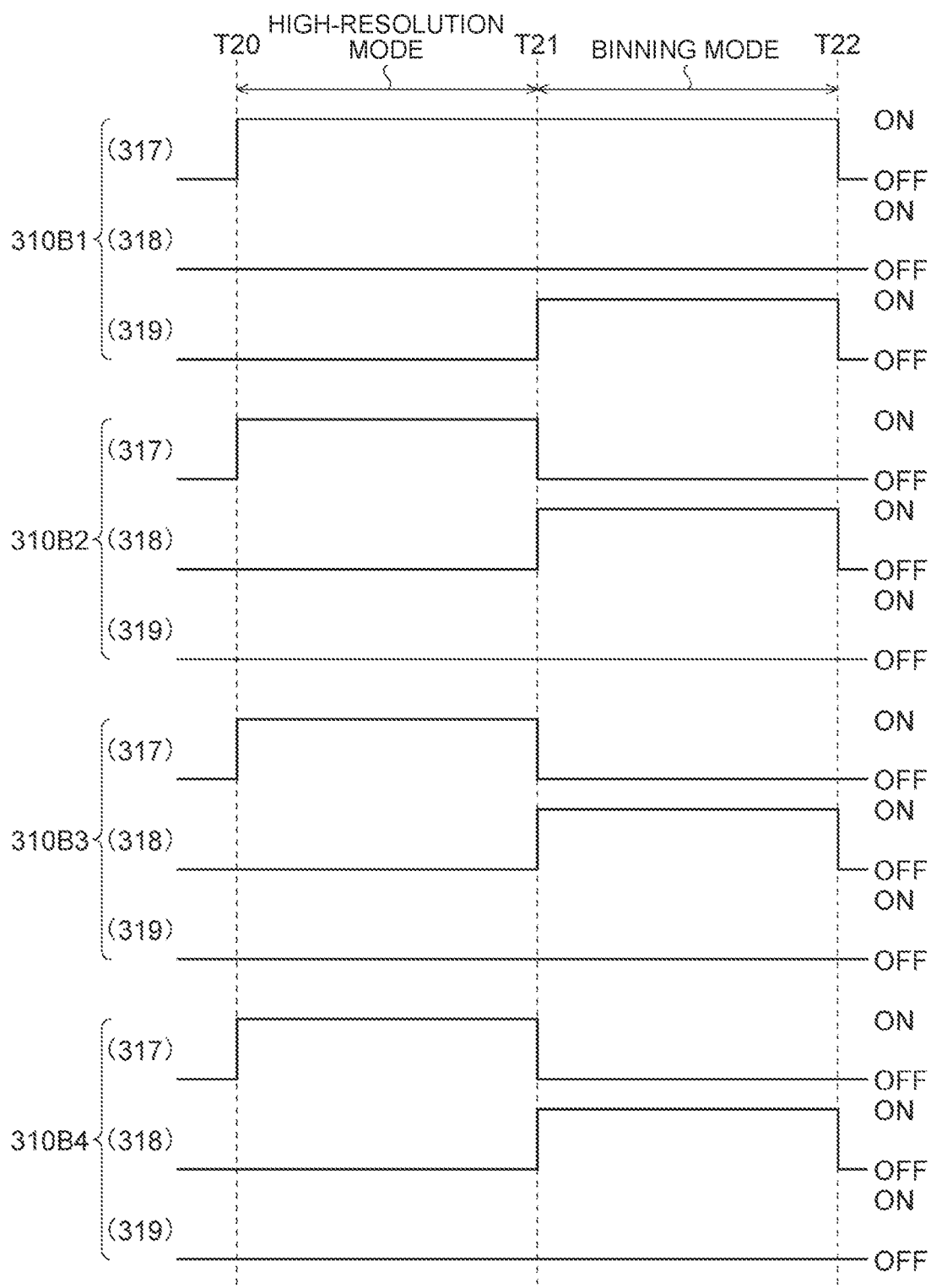
FIG. 23 is a timing chart depicting exemplary control of switching transistors in a high-resolution mode and a binning mode according to the second embodiment.

Next, an operation example of the logarithmic response section 310Bn will be described. FIG. 23 is a timing chart depicting exemplary control of the switching transistors in the high-resolution mode and the binning mode according to the present embodiment. As depicted in FIG. 23, in the high-resolution mode depicted in sections T20 to T21, in each of the logarithmic response sections 310B1 to 310B4, the switching transistors 317 and 319 are turned off, and the switching transistor 318 is turned on. This leads to formation of a current path through which the photocurrent flowing out of the photoelectric conversion element 311 of each logarithmic response sections 310B1 to 310B4 flows into their own logarithmic conversion circuits.

In contrast, in the binning mode depicted in the sections T21 to T22, the switching transistor 317 of the logarithmic response section 310B1 is turned on, the switching transistor 318 is turned off, and the switching transistor 319 is turned on. On the other hand, in the logarithmic response sections 310B2 to 310B4, the switching transistor 317 is turned off, the switching transistor 318 is turned on, and the switching transistor 319 is turned off. This leads to formation of a current path through which the photocurrent flowing out of the photoelectric conversion element 311 of each logarithmic response sections 310B1 to 310B4 flows into the logarithmic conversion circuit of the logarithmic response section 310B1.

2.4 Action and Effects

As described above, according to the present embodiment, it is possible, in the binning mode, to form a current path in which the photocurrent flowing through the common line 3101 flows into the logarithmic conversion circuit of the logarithmic response section 310B1 through the switching transistor 319 of the logarithmic response section 310B1 without passing through the switching transistor 318 of the logarithmic response section 310B1, the cathode of the photoelectric conversion element 311, or the switching transistor 317. This makes it is possible to greatly relax the restriction on the potential design ranging from the switching transistor 318 to the switching transistor 317.

Since other configurations, operations, and effects may be similar to those in the above-described embodiment, detailed description will be omitted here.

3. Third Embodiment

Next, a third embodiment will be described in detail with reference to the drawings. In the present embodiment, still another configuration of the shared block 221 described with reference to FIG. 17 in the first embodiment will be described with an example.

The configurations and operations of the imaging device and the solid-state imaging device according to the present embodiment may be similar to the configurations and operations of the imaging device 100 and the solid-state imaging device 200 according to the first embodiment described above, and thus, detailed description will be omitted here. However, in the present embodiment, the shared block 221 according to the first embodiment is replaced with a shared block 721 to be described below.

3.1 Configuration Example of Shared Block

Figure 24:
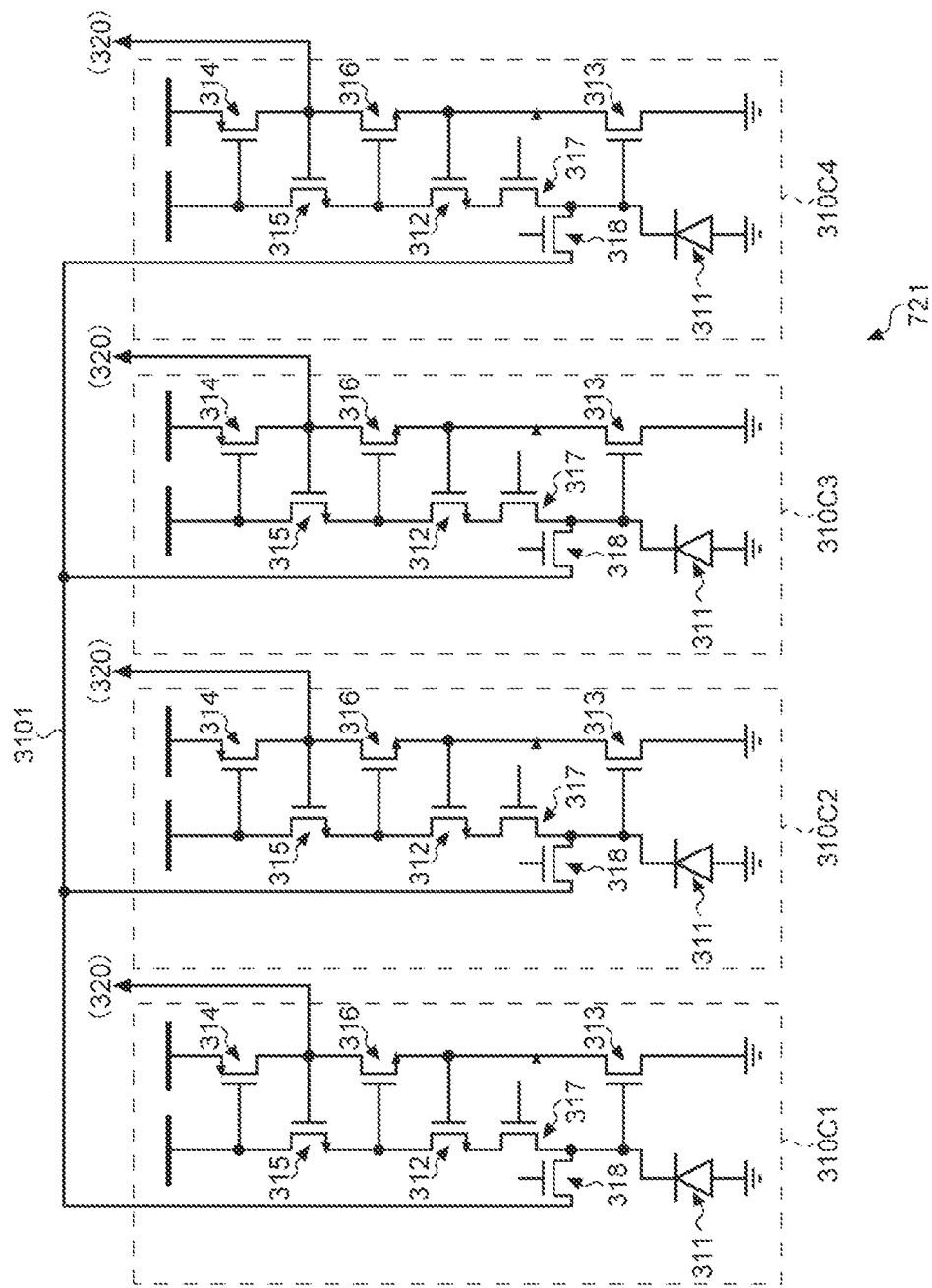
FIG. 24 is a circuit diagram depicting a schematic configuration example of a shared block according to a third embodiment.

FIG. 24 is a circuit diagram depicting a schematic configuration example of a shared block according to the present embodiment. A logarithmic response section 310Cn exemplified below is an example of a logarithmic response section based on the gain boost type logarithmic response section 310A exemplified in FIG. 7. However, the configuration is not limited thereto, and it is also allowable, for example, to have the logarithmic response section 310B based on various circuits that generate voltage signals corresponding to logarithmic values of photocurrent, such as the source follower type logarithmic response section 310 exemplified in FIG. 6. Further, the following description uses an exemplary case where one shared block 721 includes a total of four logarithmic response sections 310Cn in a 2 row×2 column pattern. However, the configuration is not limited to this example, and each shared block 721 may include one or two or more logarithmic response sections 310Cn.

As depicted in FIG. 24, logarithmic response sections 310C1 to 310C4 according to the present embodiment (in the present description, represented by using the reference numeral 310Cn when the logarithmic response sections 310C1 to 310C4 are not distinguished from each other) each have a configuration in which a switching transistor 319 is omitted from a configuration similar to the logarithmic response section 310Bn described with reference to FIG. 21 in the second embodiment. Further, in the logarithmic response section 310Cn, the drain of the switching transistor 317 is connected to the source of the nMOS transistor 312, the source is connected to the gate of the nMOS transistor 313 and the cathode of the photoelectric conversion element 311, and the drain of the switching transistor 318 is connected to the source of the switching transistor 317, the gate of the nMOS transistor 313, and the cathode of the photoelectric conversion element 311.

3.2 Operation Example (Timing Chart)

Figure 25:
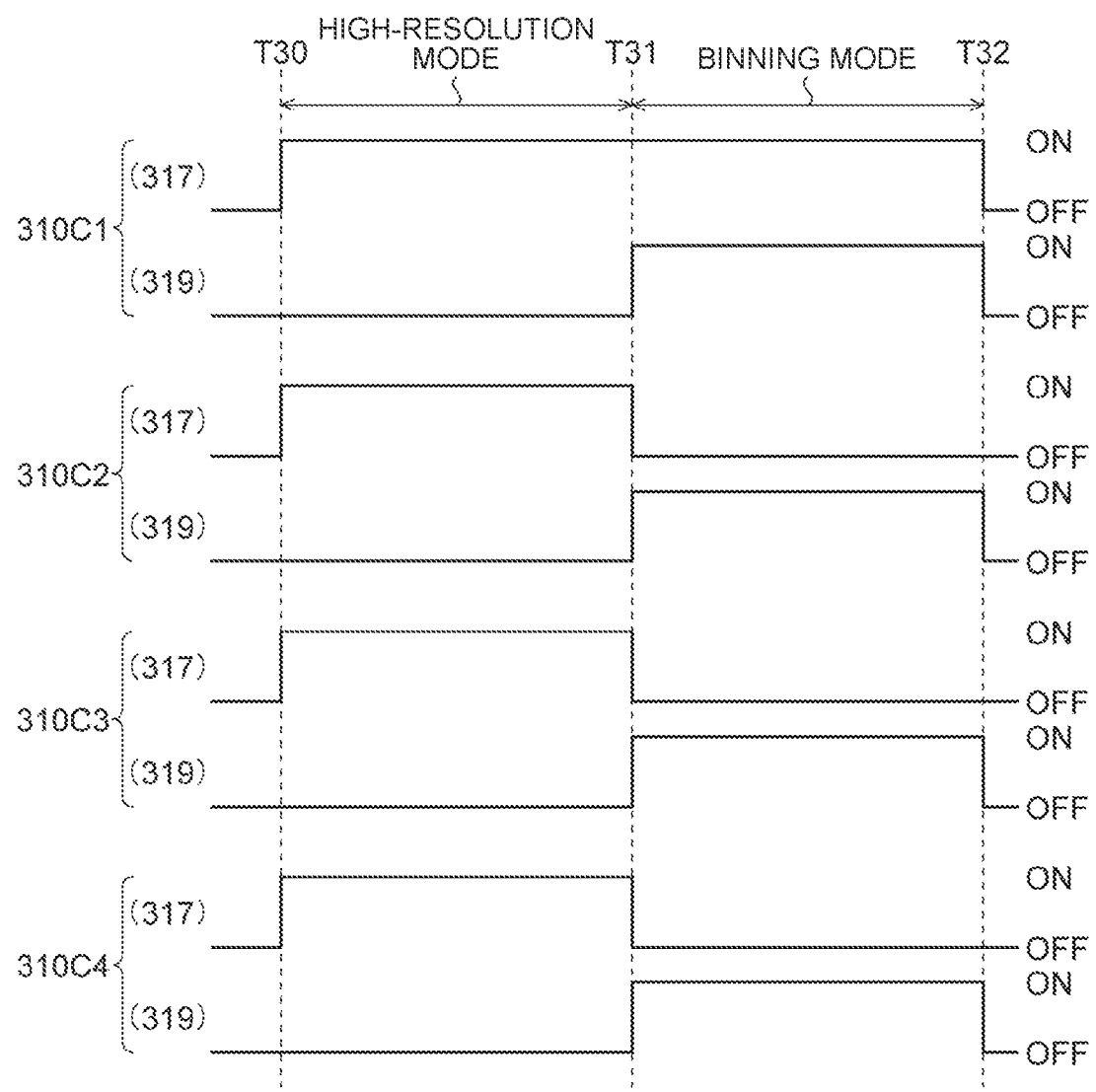
FIG. 25 is a timing chart depicting exemplary control of switching transistors in a high-resolution mode and a binning mode according to the third embodiment.

Next, an operation example of the logarithmic response section 310Cn will be described. FIG. 25 is a timing chart depicting exemplary control of the switching transistors in the high-resolution mode and the binning mode according to the present embodiment. As depicted in FIG. 25, in the high-resolution mode depicted in sections T30 to T31, in each logarithmic response sections 310C1 to 310B4, the switching transistor 317 is turned on, and the switching transistor 318 is turned off. This leads to formation of a current path through which the photocurrent flowing out of the photoelectric conversion element 311 of each logarithmic response sections 310C1 to 310C4 flows into their own logarithmic conversion circuits.

In contrast, in the binning mode depicted in the sections T31 to T32, both the switching transistors 317 and 318 of the logarithmic response section 310C1 are turned on. On the other hand, in the logarithmic response sections 310C2 to 310C4, the switching transistor 317 is turned off while the switching transistor 318 is turned on. This leads to formation of a current path through which the photocurrent flowing out of the photoelectric conversion element 311 of each logarithmic response sections 310C1 to 310C4 flows into the logarithmic conversion circuit of the logarithmic response section 310C1.

3.3 Action and Effects

As described above, according to the present embodiment, for example, as compared with the second embodiment, since the switching transistor 319 can be omitted, it is possible to reduce the area occupied by the logarithmic response section 310Cn in the pixel area. This makes it possible increase the area of the light receiving surface of the photoelectric conversion element 311, leading to achievement of sensitivity improvement and the dynamic range expansion of the solid-state imaging device 200. In addition, omission of the switching transistor 319 makes it possible to further reduce the drive current.

Since other configurations, operations, and effects may be similar to those in the above-described embodiment, detailed description will be omitted here.

4. Fourth Embodiment

The above embodiment is an exemplary configuration in which the solid-state imaging device 200 outputs frame data (corresponding to image data) including the detection signal indicating the presence or absence of the address event for each pixel. In contrast, the fourth embodiment will be described, with an example, regarding a configuration in which the solid-state imaging device 200 can also output image data (hereinafter, also referred to as gradation image data) including a pixel signal according to an exposure amount of each pixel in addition to image data including a detection signal of each pixel.

The configurations and operations of the imaging device and the solid-state imaging device according to the present embodiment may be similar to the configurations and operations of the imaging device 100 and the solid-state imaging device 200 according to the first embodiment described above, and thus, detailed description will be omitted here. However, in the present embodiment, the shared block 221 according to the first embodiment is replaced with a shared block 821 to be described below, and the detection chip 202 is replaced with a detection chip 802 to be described below.

4.1 Configuration Example of Shared Block

Figure 26:
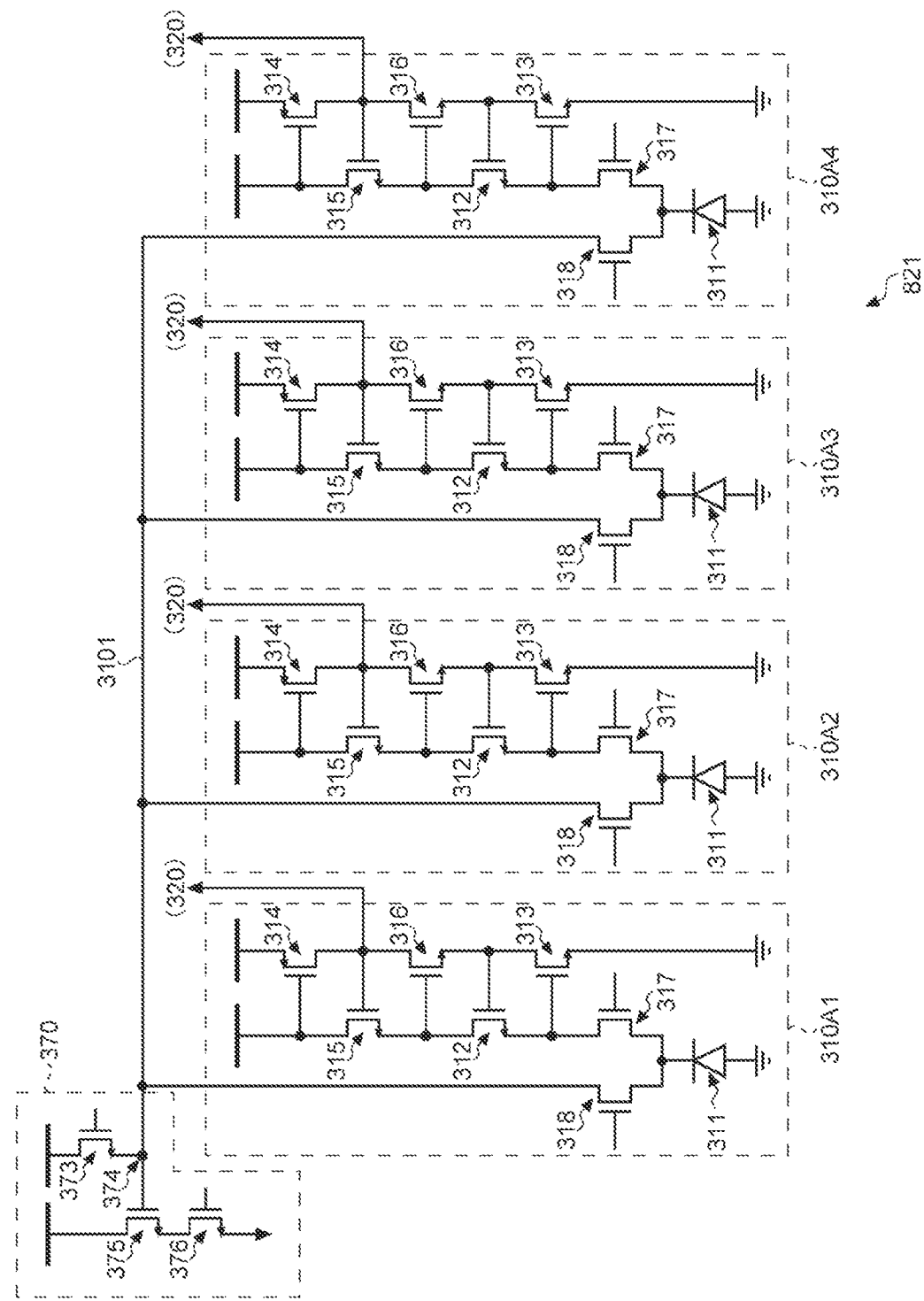
FIG. 26 is a circuit diagram depicting a schematic configuration example of a shared block according to a fourth embodiment.

FIG. 26 is a circuit diagram depicting a schematic configuration example of a shared block according to the present embodiment. The shared block 821 exemplified below is based on the shared block 221 exemplified in FIG. 17. However, the configuration is not limited thereto, and the shared block 821 may be based on the shared block 621 according to the second embodiment or the shared block 721 according to the third embodiment, for example.

As depicted in FIG. 26, the shared block 821 according to the present embodiment has a configuration in which a readout circuit 370 for reading a pixel signal is connected to the common line 3101 in a configuration similar to the shared block 221 described with reference to FIG. 17 in the first embodiment.

4.1.1 Modification of Shared Block

Figure 27:
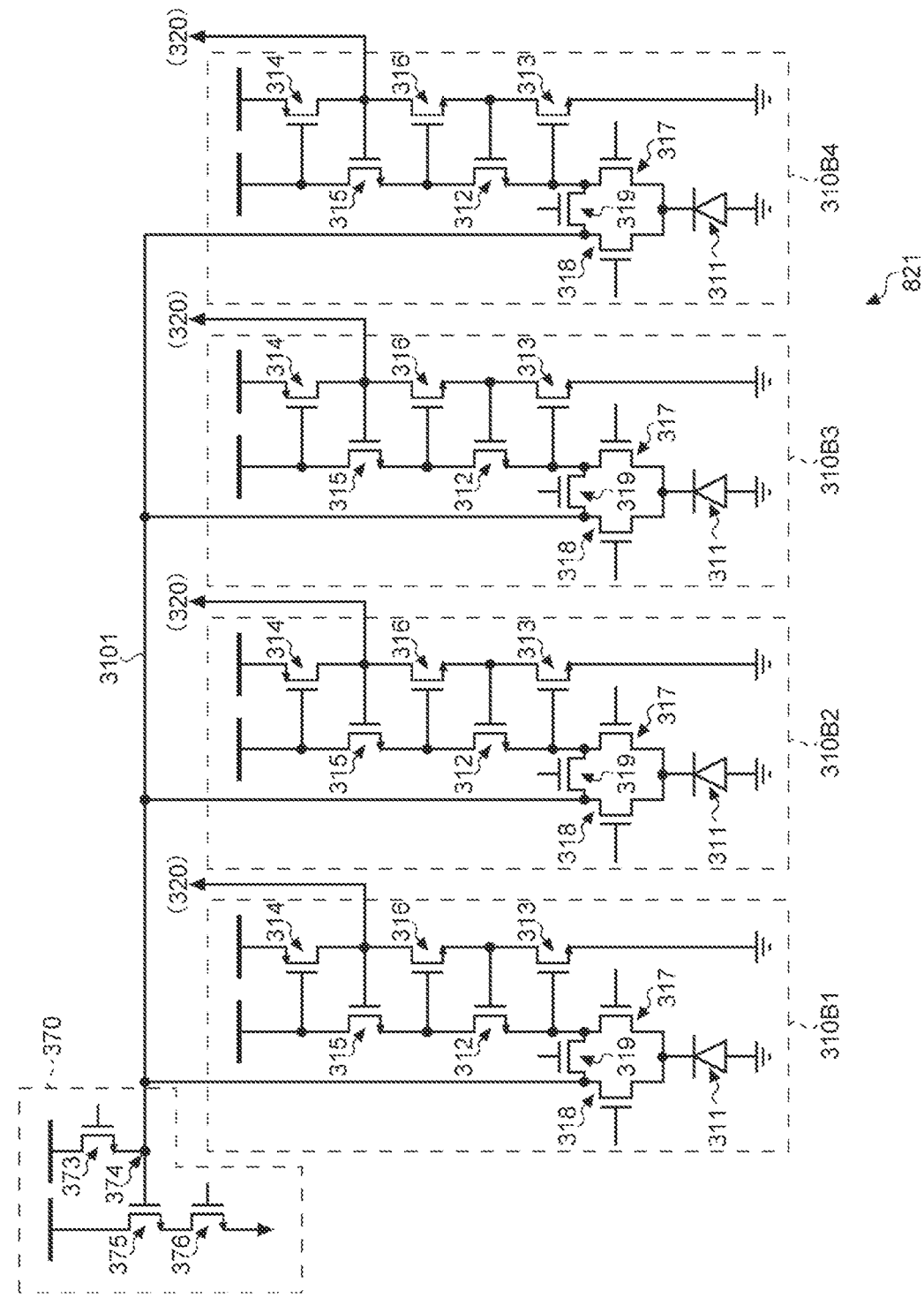
FIG. 27 is a circuit diagram depicting a schematic configuration example of a shared block according to a modification of the fourth embodiment.

Further, the shared block 821 according to the present embodiment can also be formed on the basis of the shared block 621 described in the second embodiment with reference to FIG. 21, for example. Also in this case, as depicted in FIG. 27, the shared block 821 has a configuration similar to the shared block 621 described with reference to FIG. 21, in which a readout circuit 370 for reading a pixel signal is connected to the common line 3101.

4.2 Configuration Example of Readout Circuit

Figure 28:
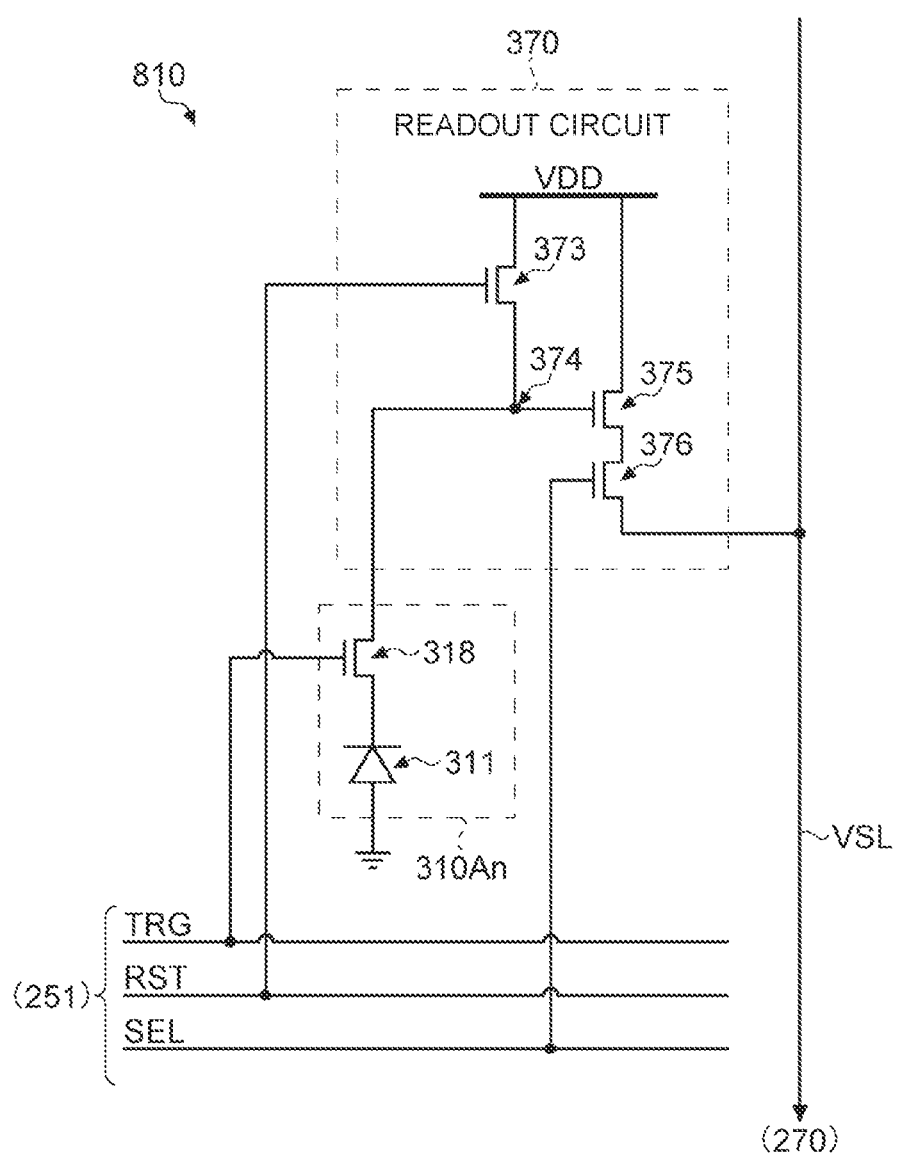
FIG. 28 is a circuit diagram depicting a schematic configuration example of a readout circuit according to the fourth embodiment.

FIG. 28 is a circuit diagram depicting a schematic configuration example of a readout circuit according to the present embodiment. As depicted in FIG. 28, the readout circuit 370 according to the present embodiment includes a reset transistor 373, an amplification transistor 375, and a selection transistor 376.

The readout circuit 370 operates together with the photoelectric conversion element 311 and the switching transistor 318 of the logarithmic response sections 310An to function as a gradation pixel 810 that generates a pixel signal corresponding to the amount of received light. That is, in the present embodiment, the switching transistor 318 of each logarithmic response section 310An also functions as a transfer transistor in the gradation pixel 810. Further, a node to which the drain of the switching transistor 318, the source of the reset transistor 373, and the gate of the amplification transistor 375 are connected functions as a floating diffusion region (FD) 374 having a current-voltage conversion function, that is, a function of converting accumulated charge into a voltage corresponding to the charge amount.

The drain of the reset transistor 373 and the drain of the amplification transistor 375 are connected to a power supply voltage VDD, for example. However, the drain of the reset transistor 373 may be connected to a reset voltage different from the power supply voltage VDD, for example. A source of the amplification transistor 375 is connected to a drain of the selection transistor 376, and a source of the selection transistor 376 is connected to a vertical signal line VSL for inputting an analog pixel signal to a column analog to digital converter (column ADC) 270 to be described below.

When the pixel signal is read, a high-level transfer signal TRG is applied from the row drive circuit 251 to the gate of the switching transistor 318. This turns on the switching transistor 318, causing the charge accumulated in the cathode of the photoelectric conversion element 311 to be transferred to the floating diffusion region 374 through the switching transistor 318. As a result, a pixel signal having a voltage value corresponding to the charge amount of the charge accumulated in the floating diffusion region 374 appears at the source of the amplification transistor 375. Subsequently, by setting the selection signal SEL applied from the row drive circuit 251 to the gate of the selection transistor 376 to the high level, the pixel signal appearing in the source of the amplification transistor 375 appears in the vertical signal line VSL.

Further, when the charge accumulated in the floating diffusion region 374 is released to reset the floating diffusion region 374, a high-level reset signal RST is applied from the row drive circuit 251 to the gate of the reset transistor 373. This allows the charge accumulated in the floating diffusion region 374 to be discharged to the power supply side through the reset transistor 373 (FD reset). At that time, by turning on the switching transistor 318 during the same period, it is also possible to discharge the charge accumulated in the cathode of the photoelectric conversion element 311 to the power supply side (PD reset).

In each shared block 821, the number of photoelectric conversion elements 311 simultaneously connected to the readout circuit 370 at the time of reading out the gradation image data, that is, the number of switching transistors 318 (transfer transistors) turned on during the same period of time is not limited to one, and may be plural. For example, when high-resolution gradation image data is read in each shared block 821, the switching transistors 318 may be sequentially connected to the readout circuit 370 in time division, and when reading is executed with an expanded dynamic range at low illuminance or the like (at the time of binning), two or more switching transistors 318 may be turned on during the same period of time.

4.3 Configuration Example of Detection Chip

Figure 29:
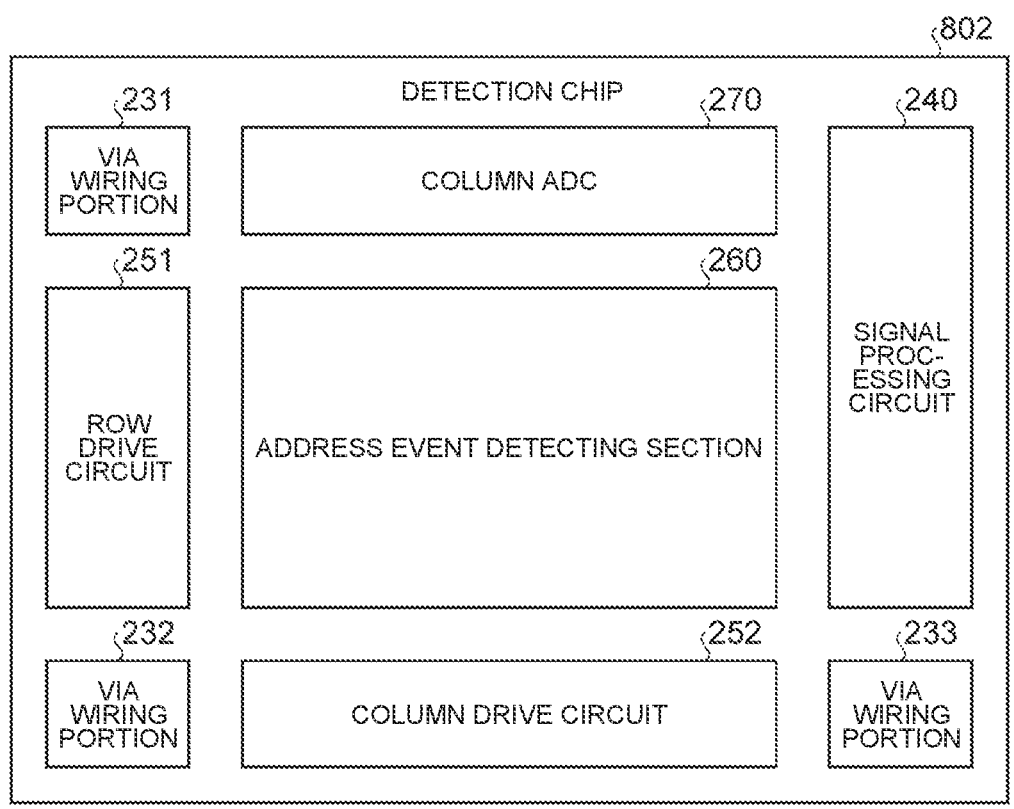
FIG. 29 is an example of a plan view of a detection chip according to the fourth embodiment.

FIG. 29 is an example of a plan view of the detection chip according to the present embodiment. The detection chip 802 according to the present embodiment has a configuration in which a column ADC 270 for reading an analog pixel signal output from the gradation pixel 810 as a digital pixel signal is added to a configuration similar to the detection chip 202 described with reference to FIG. 4 in the first embodiment.

Each gradation pixel 810 causes an analog pixel signal to appear on the vertical signal line VSL under the control of the row drive circuit 251, thereby supplying the analog pixel signal to the column ADC 270. The column ADC 270 includes, for example, an AD converter for each vertical signal line VSL, and performs analog to digital (AD) conversion on an analog pixel signal input via each vertical signal line VSL. Subsequently, the column ADC 270 supplies the digital signal that has undergone AD conversion to the signal processing circuit 240. The signal processing circuit 240 performs predetermined image processing on the image data including the digital signals. Note that the column ADC 270 may include, for example, a correlated double sampling (CDS) circuit and may reduce kTC noise included in a digital pixel signal.

4.4 Operation Example

Figure 30:
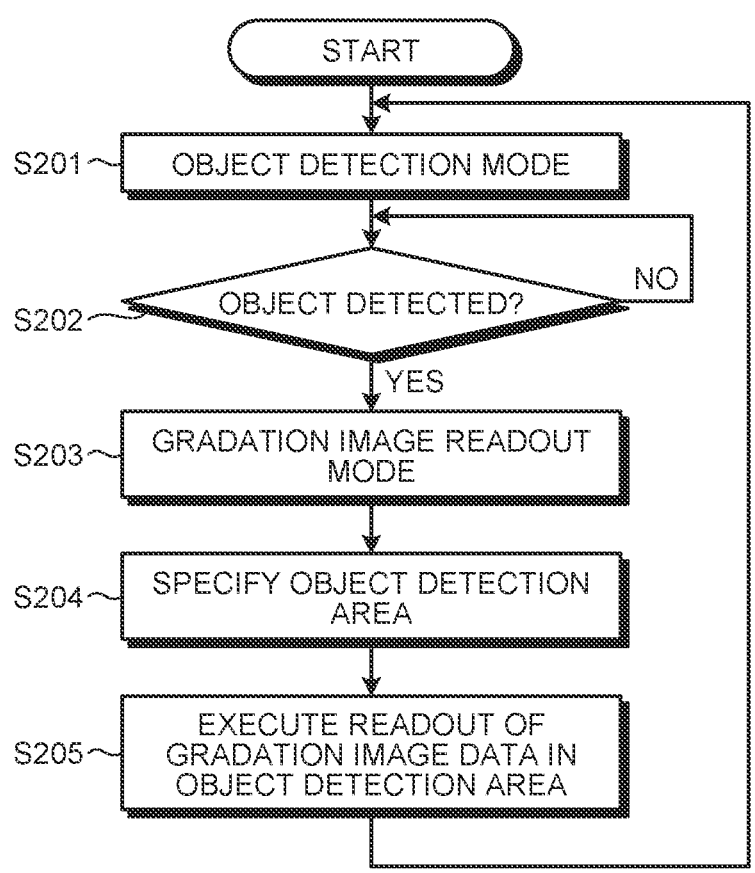
FIG. 30 is a flowchart depicting an operation example of switching execution of an object detection mode and a grayscale image readout mode according to the fourth embodiment.

The readout of the gradation image data may be executed, for example, by reading the pixel signals from all the gradation pixels 810 when the occurrence of the address event is detected in any of the detection pixels 300, or may be executed by reading the pixel signals from the gradation pixels 810 belonging to the region where the occurrence of the address event is detected, in other words, the region where the object is detected by the detection pixel 300. FIG. 30 depicts an operation example in which the object detection mode and the grayscale image read mode according to the present embodiment are switched in execution of operation. The present description will describe an exemplary case where the control section 130 (refer to FIG. 1) in the imaging device 100 controls the operation mode of the solid-state imaging device 200. However, control of the operation mode is not limited to this example and the signal processing circuit 240 in the solid-state imaging device 200 may be configured to control the operation mode. Further, the operation depicted in FIG. 30 may be terminated by, for example, an interruption operation or the like with respect to the control section 130 or the solid-state imaging device 200.

As depicted in FIG. 30, in the present operation, after activation, the control section 130 sets the object detection mode to the operation mode of the solid-state imaging device 200, for example (step S201). The object detection mode is an operation mode of detecting occurrence of an address event, and may be, for example, a mode of executing the operation described with reference to FIG. 20 in the first embodiment.

Next, the control section 130 determines whether an object has been detected in the object detection mode (step S202), and continues the address event detection mode until the object is detected (NO in step S202). For example, the object detection determination may be similar to the operation described in steps S102, S105, and S108 in FIG. 20 in the first embodiment.

In a case where an object has been detected (YES in step S202), the control section 130 specifies a region where the object has been detected on the basis of frame data output from the solid-state imaging device 200 (step S203). Note that the region in which the object has been detected may be, for example, a region including pixels in which an on-event (or an off-event) has been detected.

Next, the control section 130 instructs the solid-state imaging device 200 to read the pixel signal from the region where the object has been detected (step S204). With this operation, gradation image data including the pixel signals read from the gradation pixel 810 belonging to the region where the object has been detected is output from the solid-state imaging device 200.

4.5 Action and Effects

As described above, according to the present embodiment, it is possible to perform not only the detection of the object based on the presence or absence of the address event but also the acquisition of the gradation image data of the region where the object has been detected or of all the pixels.

Since other configurations, operations, and effects may be similar to those in the above-described embodiment, detailed description will be omitted here.

5. Fifth Embodiment

The above-described fourth embodiment is an exemplary configuration in which in which the readout circuit 370 is connected to the common line 3101 in the configuration enabling readout of the gradation image data in addition to object detection. In comparison, in the fifth embodiment, a case where the readout circuit 370 is connected to a common line different from the common line 3101 will be described with an example.

The configurations and operations of the imaging device and the solid-state imaging device according to the present embodiment may be similar to the configurations and operations of the imaging device 100 and the solid-state imaging device 200 according to the fourth embodiment described above, and thus, detailed description will be omitted here. However, in the present embodiment, the shared block 821 according to the fourth embodiment is replaced with a shared block 921 to be described below.

5.1 Configuration Example of Shared Block

Figure 31:
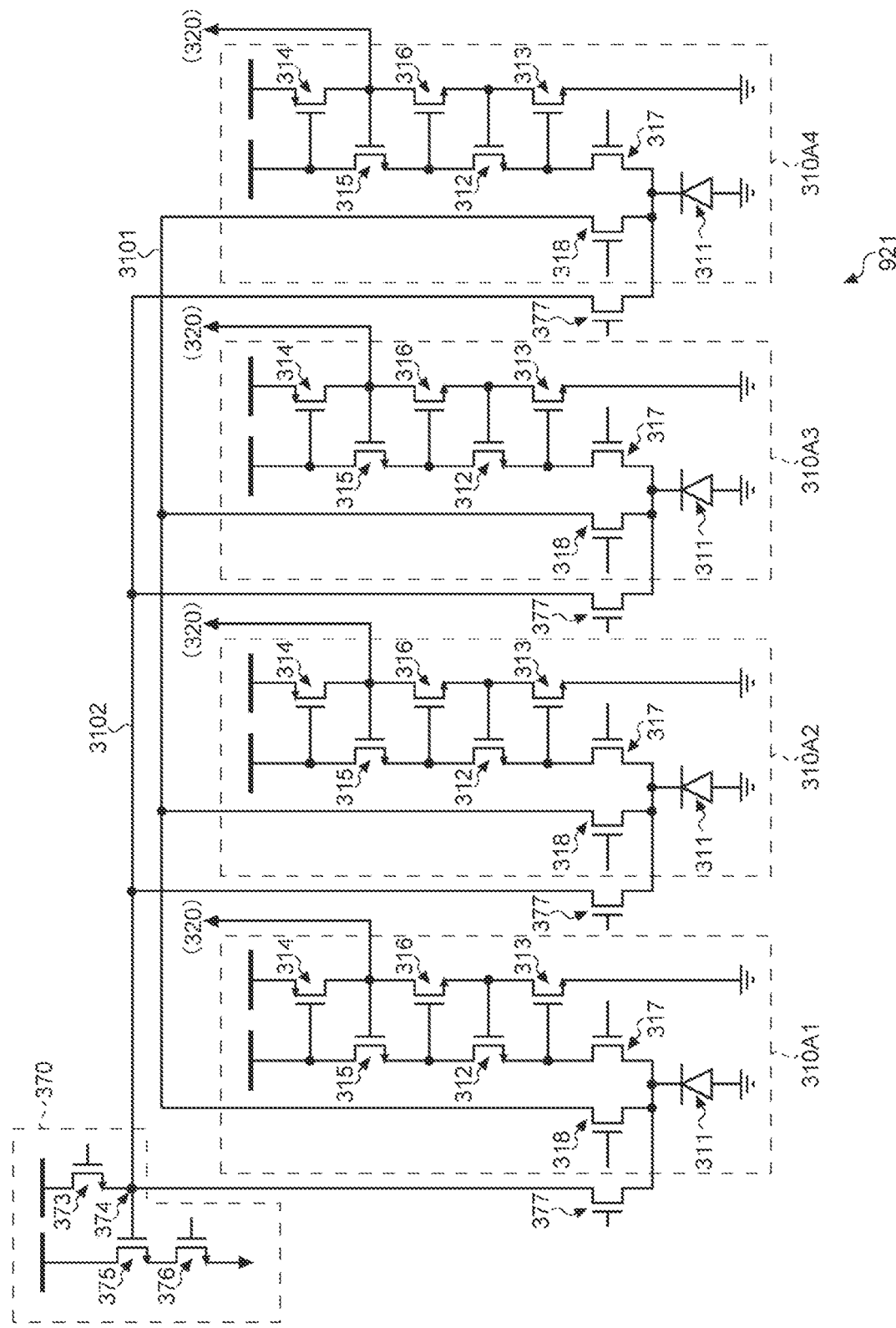
FIG. 31 is a circuit diagram depicting a schematic configuration example of a shared block according to a fifth embodiment.

FIG. 31 is a circuit diagram depicting a schematic configuration example of a shared block according to the present embodiment. The shared block 921 exemplified below is based on the shared block 221 exemplified in FIG. 17. However, the configuration is not limited thereto, and the shared block 921 may also be based on the shared block 621 according to the second embodiment or the shared block 721 according to the third embodiment, for example.

As depicted in FIG. 31, the shared block 921 according to the present embodiment has a configuration in which cathodes of photoelectric conversion elements 311 in two or more or all logarithmic response sections 310An are connected by a common line 3102 different from the common line 3101 in a configuration similar to the shared block 221 described with reference to FIG. 17 in the first embodiment. The readout circuit 370 is connected to the common line 3102. In addition, a switching transistor 377 also functioning as a transfer transistor is provided between the readout circuit 370 and the photoelectric conversion element 311 of each logarithmic response section 310An, and connection between the photoelectric conversion element 311 and the readout circuit 370 is controlled by the switching transistor 377. For example, the common line 3102 may be an example of a second common line in the claims.

5.1.1 Modification of Shared Block

Figure 32:
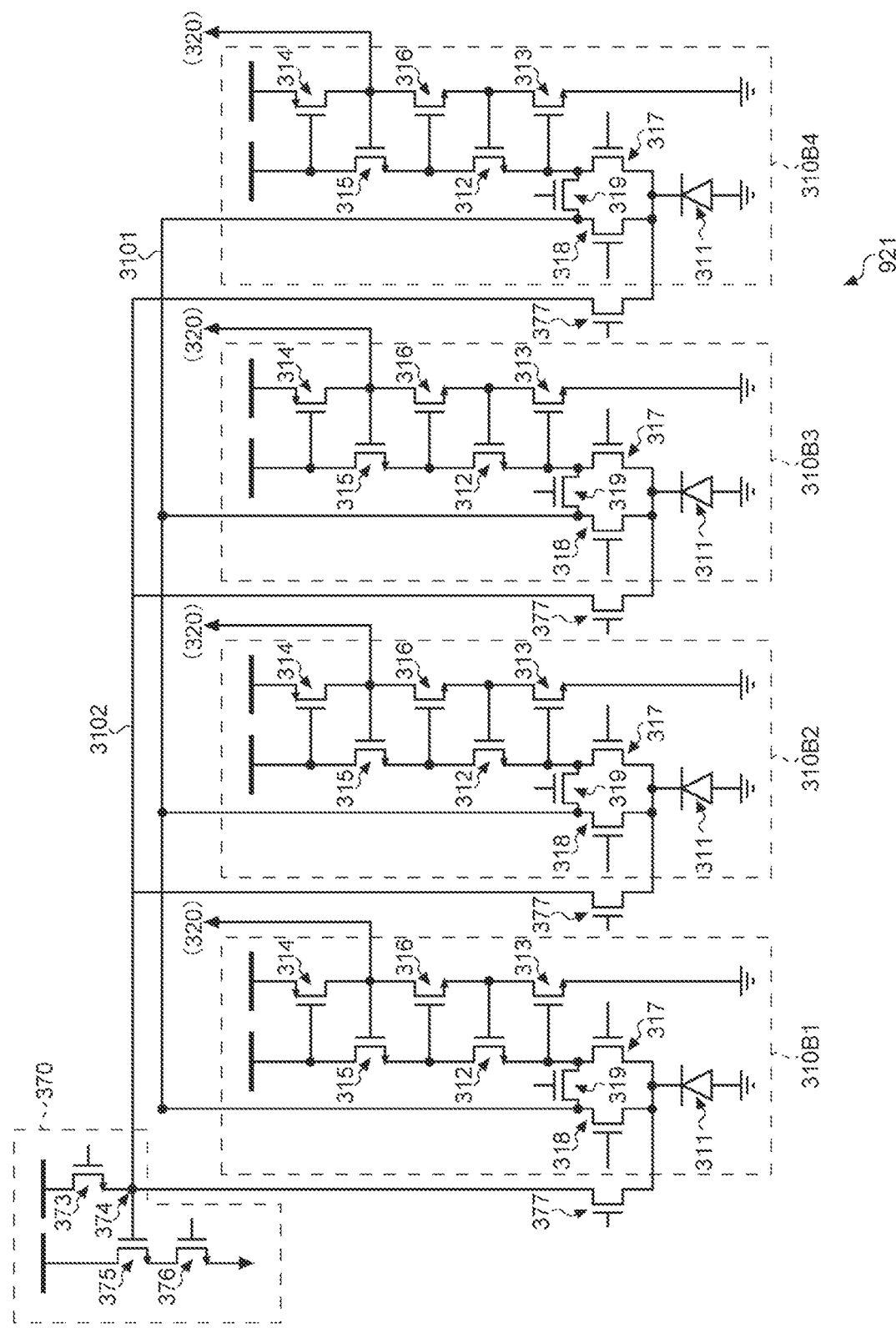
FIG. 32 is a circuit diagram depicting a schematic configuration example of a shared block according to a modification of the fifth embodiment.

Further, the shared block 921 according to the present embodiment can also be formed based on the shared block 621 described in the second embodiment with reference to FIG. 21, for example. Even in this case, as depicted in FIG. 32, the shared block 921 has a configuration, as a configuration similar to the shared block 621 described with reference to FIG. 21, in which the cathodes of the photoelectric conversion elements 311 in two or more or all of the logarithmic response sections 310An are connected by the common line 3102, the readout circuit 370 is connected to the common line 3102, and the switching transistor 377 is provided between the readout circuit 370 and the photoelectric conversion element 311 of each of the logarithmic response sections 310An.

5.2 Operation Example

In the above configuration, at the time of reading the pixel signal from the gradation pixel including the readout circuit 370, the switching transistors 317 and 318 of all the logarithmic response sections 310An are turned off, and the switching transistors 377 of the gradation pixels corresponding to the individual logarithmic response sections 310An are sequentially connected to the readout circuit 370 in time division. However, at the time of binning, when reading is executed with an expanded dynamic range at low illuminance or the like, two or more switching transistors 318 are turned on during the same period of time, achieving execution of readout with an expanded dynamic range.

6. Sixth Embodiment

Figure 33:
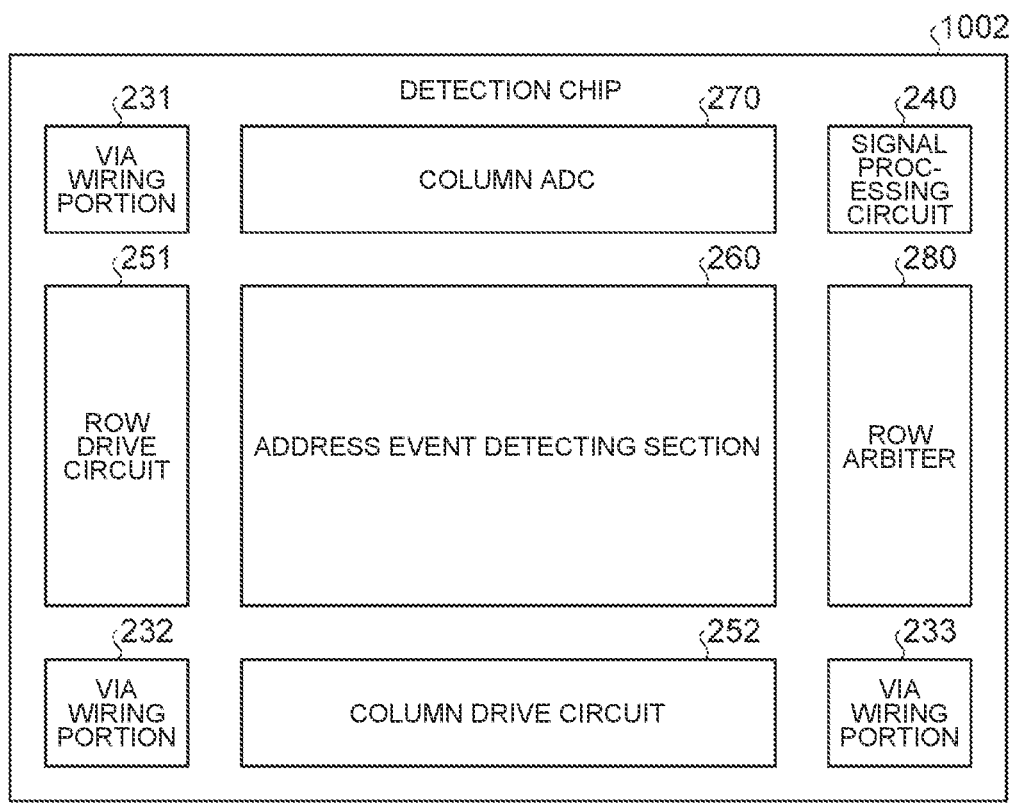
FIG. 33 is an example of a plan view of a detection chip according to a sixth embodiment.

The above-described embodiment is an exemplary case in which the synchronous EVS that does not require arbitration of a request for requesting reading of a detection signal output from each shared block 221 or the like is applied to the solid-state imaging device 200. However, the configuration is not limited to such an example. For example, as in the solid-state imaging device depicted in FIG. 33, it is also allowable to apply an asynchronous EVS including a row arbiter 280 that arbitrates requests output from each row of the address event detecting section 260 and determines the order of readout rows of detection signals. Note that FIG. 33 depicts a detection chip 1002 in the solid-state imaging device according to the present embodiment.

In this manner, even in a case where an asynchronous EVS is applied, it is possible to aggregate the photocurrents flowing out from the plurality of photoelectric conversion elements 311 into one logarithmic conversion circuit similarly to the above-described embodiments, making it possible to obtain a larger photocurrent amount. This achieves expansion of the dynamic range in the photocurrent detection, making it possible to obtain a sufficiently wide dynamic range even under conditions such as low illuminance.

On the other hand, in a case where sufficient illuminance can be obtained, by turning off the switching transistor 318 and turning on the switching transistor 317 in all or a necessary and sufficient number of logarithmic response sections 310An or the like, it is possible to operate all or the necessary and sufficient number of logarithmic response sections 310An or the like as one address event detection pixel, leading to achievement of detection of an address event at high resolution, reduction of operating power, and the like.

Since other configurations, operations, and effects may be similar to those in the above-described embodiment, detailed description will be omitted here.

7. Example of Application to Moving Object

The technology according to the present disclosure (the present technology) is applicable to various products. The technology according to the present disclosure may be applied to devices mounted on any of moving objects such as automobiles, electric vehicles, hybrid electric vehicles, motorcycles, bicycles, personal mobility, airplanes, drones, ships, and robots.

Figure 34:
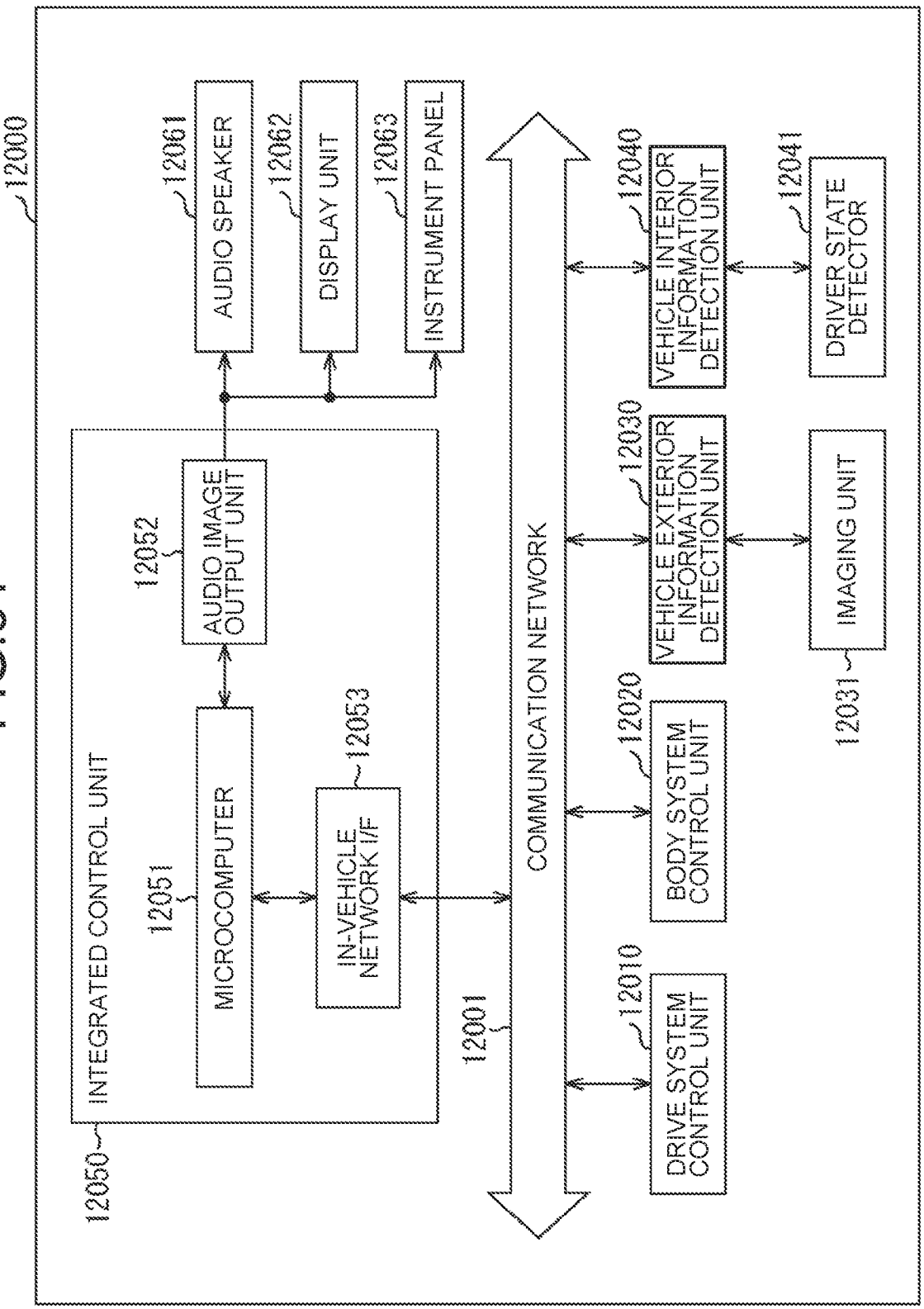
FIG. 34 is a block diagram depicting an example of schematic configuration of a vehicle control system.

FIG. 34 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 34, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

Figure 35:
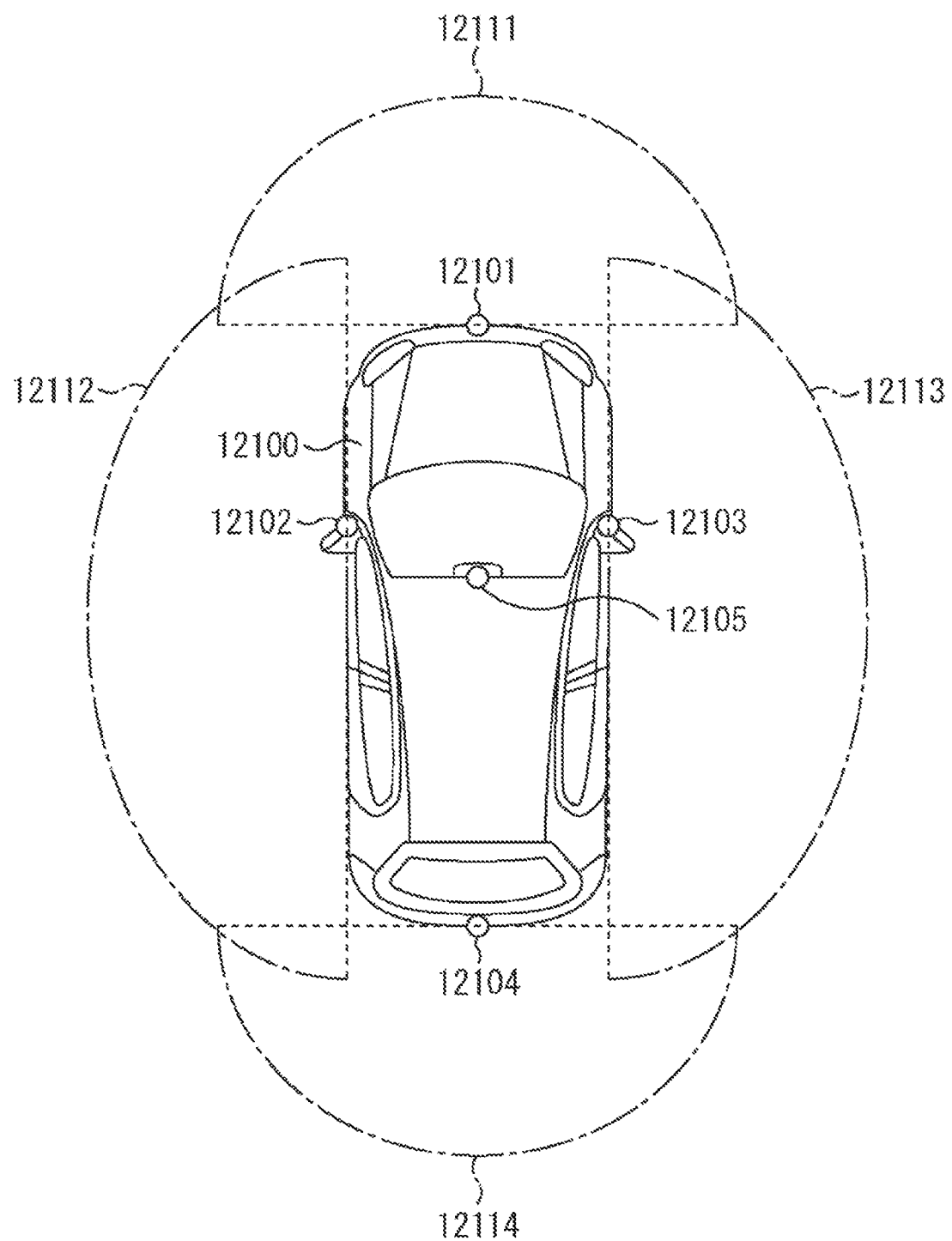
FIG. 35 is a diagram of assistance in explaining an example of installation positions of an outside-vehicle information detecting section and an imaging section.

The sound/image output section 12052 transmits an output signal of at least one of a sound and an image to an output device capable of visually or auditorily notifying information to an occupant of the vehicle or the outside of the vehicle. In the example of FIG. 35, an audio speaker 12061, a display section 12062, and an instrument panel 12063 are illustrated as the output device. The display section 12062 may, for example, include at least one of an on-board display and a head-up display.

FIG. 35 is a diagram depicting an example of the installation position of the imaging section 12031.

In FIG. 35, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 35 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Hereinabove, an example of the vehicle control system to which the technology according to the present disclosure is applicable has been described. The technology according to the present disclosure can be suitably applied to the imaging section 12031 among the configurations described above. Specifically, the imaging device 100 in FIG. 1 can be applied to the imaging section 12031. By applying the technology according to the present disclosure to the imaging section 12031, it is possible to achieve microfabrication of pixels and higher visibility in captured image, leading to alleviation of driver's fatigue.

Note that the above-described embodiment depicts an example for embodying the present technology, and thus, the matters in the embodiment and the invention specifying matters in the claims have a correspondence relationship. Similarly, the matters specifying the invention in the claims and the matters in the embodiments of the present technology denoted by the same names as the matters specifying the invention have a correspondence relationship. However, the present technology is not limited to the embodiments, and can be embodied by making various modifications to the embodiments without departing from the scope and spirit of the present technology.

The effects described in the present specification are merely examples, and thus, there may be other effects, not limited to the exemplified effects.

Note that the present technique can also have the following configurations.

(1)

A solid-state imaging device comprising:
a plurality of detection pixels that each output a luminance change of incident light;
a detection circuit that outputs an event signal based on the luminance change output from each of the detection pixels; and
a first common line connecting the plurality of detection pixels to each other,
wherein each of the detection pixels includes:
a photoelectric conversion element;
a logarithmic conversion circuit that converts a photocurrent flowing out of the photoelectric conversion element into a voltage signal corresponding to a logarithmic value of the photocurrent;
a first circuit that outputs a luminance change of incident light incident on the photoelectric conversion element based on the voltage signal output from the logarithmic conversion circuit;
a first transistor connected between the photoelectric conversion element and the logarithmic conversion circuit; and
a second transistor connected between the photoelectric conversion element and the first common line, and
the detection circuit includes a second circuit that outputs the event signal based on the luminance change output from each of the detection pixels.

(2)

The solid-state imaging device according to (1),
wherein each of the detection pixels further includes:
a third transistor connected between a first node and a second node, the first node configured to connect the first transistor and the logarithmic conversion circuit to each other, the second node configured to connect the second transistor and the first common line to each other.

(3)

The solid-state imaging device according to (1), wherein the second transistor is connected between the first common line and a node, the node configured to connect the photoelectric conversion element and the first transistor to each other.

(4)

The solid-state imaging device according to any one of (1) to (3), further comprising a readout circuit that is connected to the first common line and generates a pixel signal having a voltage value corresponding to charge accumulated in the photoelectric conversion element.

(5)
The solid-state imaging device according to (4),
wherein the readout circuit includes:
a reset transistor connected between the first common line and a power supply line; and
an amplification transistor having a gate connected to the first common line.

(6)
The solid-state imaging device according to any one of (1) to (3), further comprising:
a second common line connecting the plurality of detection pixels to each other;
a plurality of fourth transistors connected between the photoelectric conversion element in each of the detection pixels and the second common line; and
a readout circuit that is connected to the second common line and generates a pixel signal having a voltage value corresponding to charge accumulated in the photoelectric conversion element.

(7)
The solid-state imaging device according to (6),
wherein the readout circuit includes:
a reset transistor connected between the second common line and a power supply line; and
an amplification transistor having a gate connected to the second common line.

(8)
The solid-state imaging device according to any one of (1) to (7),
wherein each of the detection pixels further includes
a differentiator that generates a differential signal indicating a conversion amount of the voltage signal output from the logarithmic conversion circuit.

(9)
The solid-state imaging device according to (8),
wherein the detection circuit includes:
a selecting section that selects one of the differential signals output from each of the detection pixels; and
a comparator that outputs the event signal based on the differential signal.

(10)
The solid-state imaging device according to (9),
wherein the comparator includes:
a first comparator that detects that a voltage value of the differential signal exceeds a first threshold and outputs the event signal; and
a second comparator that detects that a voltage value of the differential signal has fallen below a second threshold of a voltage level lower than the first threshold and outputs the event signal.

(11)
The solid-state imaging device according to any one of (1) to (10), comprising
a plurality of the detection circuits,
each of the detection circuits configured to output a request for requesting readout of a detection signal from the detection circuit when having detected an address event in at least one of the plurality of detection pixels,
an arbiter configured to arbitrate the request output from at least one of the plurality of detection circuits and determine a readout order of the detection signal for the detection circuit that has output the request.

(12)
The solid-state imaging device according to any one of (1) to (11), further comprising a first chip including a light receiving section, the light receiving section having a plurality of logarithmic response sections being arranged in a two-dimensional lattice pattern, each of the plurality of logarithmic response sections including the photoelectric conversion element, the logarithmic conversion circuit, the first transistor, and the second transistor.

(13)
The solid-state imaging device according to (12),
wherein the logarithmic conversion circuit includes:
a fourth transistor having a source connected to the first transistor; and
a fifth transistor having a gate connected to the source of the fourth transistor and having a source grounded, and
the fourth transistor has a gate connected to a drain of the fifth transistor.

(14)
The solid-state imaging device according to (13),
wherein the logarithmic conversion circuit includes:
a sixth transistor having a source connected to a drain of the fourth transistor and having a drain connected to a power supply line; and
a seventh transistor having a gate connected to the drain of the fourth transistor and having a source connected to the drain of the fifth transistor,
wherein the sixth transistor has a gate connected to a drain of the seventh transistor.

(15)
The solid-state imaging device according to (12),
wherein the light receiving section further includes a pixel isolation section extending in a lattice pattern, and
each of the logarithmic response sections is provided in each of pixel regions partitioned into the two-dimensional lattice pattern by the pixel isolation section.

(16)
The solid-state imaging device according to (15),
wherein the first and second transistors, at least two transistors different from the first or second transistors, and the photoelectric conversion element are disposed in the pixel region,
the at least two transistors are disposed at positions across the photoelectric conversion element in the pixel region, and
the logarithmic conversion circuit is constituted by using at least one of the at least two transistors in each of the two pixel regions adjacent to each other.

(17)
The solid-state imaging device according to any one of (12) to (16), further comprising
a second chip on which a plurality of the detection circuits is disposed,
wherein the first chip and the second chip constitute a single stacked chip.

(18)
An imaging device comprising:
the solid-state imaging device according to any one of (1) to (17); and
a control section that controls the solid-state imaging device.

(19)
The imaging device according to (18),
wherein the solid-state imaging device includes a plurality of shared blocks including the plurality of detection pixels, and the control section switches an operation mode of the solid-state imaging device to one of a first mode or a second mode, a first mode being a mode of performing transistor on/off in at least one of the plurality of shared blocks, the transistor on/off configured to be performed such that the first and second transistors in one detection image out of the plurality of detection pixels are turned on, the first transistor in at least another detection image out of the plurality of detection pixels is turned off, and the second transistor is turned on, the second mode being a mode of performing transistor on/off in all of the plurality of shared blocks, the transistor on/off configured to be performed such that the first transistor of each of the plurality of detection pixels is turned on, and the second transistor is turned off.

(20)

The imaging device according to (19), wherein the first mode includes:

a third mode and a fourth mode, the third mode being a mode of performing transistor on/off in all of the plurality of shared blocks, the transistor on/off configured to be performed such that the first and second transistors in one detection image out of the plurality of detection pixels are turned on, the first transistor in at least one other detection image out of the plurality of detection pixels is turned off, and the second transistor is turned on, the fourth mode being a mode of performing transistor on/off in a part of the plurality of shared blocks and in remaining shared blocks out of the plurality of shared blocks, the transistor on/off of the fourth mode, when performed in a part of the plurality of shared blocks, configured to be performed such that the first and second transistors in one detection image out of the plurality of detection pixels are turned on, the first transistor in at least one other detection image out of the plurality of detection pixels is turned off, and the second transistor is turned on, the transistor on/off of the fourth mode, when performed in the remaining shared blocks out of the plurality of shared blocks, configured to be performed such that the first transistor of each of the plurality of detection pixels is turned on, and the second transistor is turned off, and the control section switches the operation mode of the solid-state imaging device to one of the second mode to the fourth mode.

REFERENCE SIGNS LIST 10, 20 LAYOUT PIXEL
12 PIXEL ISOLATION SECTION
100 IMAGING DEVICE
110 OPTICAL SECTION
120 RECORDING SECTION
130 CONTROL SECTION
200 SOLID-STATE IMAGING DEVICE
201 LIGHT RECEIVING CHIP
202, 802, 1002 DETECTION CHIP
211, 212, 213, 231, 232, 233 VIA ARRANGEMENT PORTION
220 LIGHT RECEIVING SECTION
221, 621, 721, 821, 921 SHARED BLOCK
240 SIGNAL PROCESSING CIRCUIT
251 ROW DRIVE CIRCUIT
252 COLUMN DRIVE CIRCUIT
260 ADDRESS EVENT DETECTING SECTION
270 COLUMN ADC
280 ROW ARBITER
300 DETECTION PIXEL
305 DETECTION CIRCUIT
310, 310A, 310An, 310Bn, 310Cn LOGARITHMIC RESPONSE SECTION
311 PHOTOELECTRIC CONVERSION ELEMENT
312, 313, 315, 316, 512 nMOS TRANSISTOR
314, 411, 511 pMOS TRANSISTOR
314c CONTACT
317 to 319, 377 SWITCHING TRANSISTOR
320 DETECTION BLOCK
330 BUFFER
340 DIFFERENTIATOR
341, 343 CAPACITOR
342 INVERTER
344 SWITCH
360 TRANSFER CIRCUIT
370 READOUT CIRCUIT
373 RESET TRANSISTOR
374 FLOATING DIFFUSION REGION
375 AMPLIFICATION TRANSISTOR
376 SELECTION TRANSISTOR
400 SELECTING SECTION
410, 420 SELECTOR
500 COMPARISON SECTION
510, 520 COMPARATOR
3101, 3102 COMMON LINE

The invention claimed is:

1. A solid-state imaging device comprising:
a plurality of detection pixels that each output a luminance change of incident light;
a detection circuit that outputs an event signal based on the luminance change output from each of the detection pixels; and
a first common line connecting the plurality of detection pixels to each other,
wherein each of the detection pixels includes:
a photoelectric conversion element;
a logarithmic conversion circuit that converts a photocurrent flowing out of the photoelectric conversion element into a voltage signal corresponding to a logarithmic value of the photocurrent;
a first circuit that outputs a luminance change of incident light incident on the photoelectric conversion element based on the voltage signal output from the logarithmic conversion circuit;
a first transistor connected between the photoelectric conversion element and the logarithmic conversion circuit;
a second transistor connected between the photoelectric conversion element and the first common line;
a second common line connecting the plurality of detection pixels to each other;
a plurality of third transistors connected between the photoelectric conversion element in each of the detection pixels and the second common line; and
a readout circuit that is connected to the second common line and generates a pixel signal having a voltage value corresponding to charge accumulated in the photoelectric conversion element, wherein
the detection circuit includes a second circuit that outputs the event signal based on the luminance change output from each of the detection pixels.

2. The solid-state imaging device according to claim 1, wherein the second transistor is connected between the first common line and a node, the node configured to connect the photoelectric conversion element and the first transistor to each other.

3. The solid-state imaging device according to claim 1, further comprising:
a readout circuit that is connected to the first common line and generates a pixel signal having a voltage value corresponding to charge accumulated in the photoelectric conversion element.

4. The solid-state imaging device according to claim 3, wherein the readout circuit includes:
a reset transistor connected between the first common line and a power supply line; and
an amplification transistor having a gate connected to the first common line.

5. The solid-state imaging device according to claim 1, wherein the readout circuit includes:
a reset transistor connected between the second common line and a power supply line; and
an amplification transistor having a gate connected to the second common line.

6. The solid-state imaging device according to claim 1, wherein each of the detection pixels further includes a differentiator that generates a differential signal indicating a conversion amount of the voltage signal output from the logarithmic conversion circuit.

7. The solid-state imaging device according to claim 1, wherein
the detection circuit is one of a plurality of the detection circuits, each of the detection circuits being configured to output a request for requesting readout of a detection signal from the detection circuit when having detected an address event in at least one of the plurality of detection pixels, and further comprising:
an arbiter configured to arbitrate the request output from at least one of the plurality of detection circuits and determine a readout order of the detection signal for the detection circuit that has output the request.

8. The solid-state imaging device according to claim 1, further comprising:
a first chip including a light receiving section, the light receiving section having a plurality of logarithmic response sections being arranged in a two-dimensional lattice pattern, each of the plurality of logarithmic response sections including the photoelectric conversion element, the logarithmic conversion circuit, the first transistor, and the second transistor.

9. The solid-state imaging device according to claim 8, wherein the logarithmic conversion circuit includes:
a fourth transistor having a source connected to the first transistor; and
a fifth transistor having a gate connected to the source of the fourth transistor and having a source grounded, and
the fourth transistor has a gate connected to a drain of the fifth transistor.

10. The solid-state imaging device according to claim 9, wherein the logarithmic conversion circuit includes:
a sixth transistor having a source connected to a drain of the fourth transistor and having a drain connected to a power supply line; and
a seventh transistor having a gate connected to the drain of the fourth transistor and having a source connected to the drain of the fifth transistor,
wherein the sixth transistor has a gate connected to a drain of the seventh transistor.

11. The solid-state imaging device according to claim 8, wherein the light receiving section further includes a pixel isolation section extending in a lattice pattern, and
each of the logarithmic response sections is provided in each of pixel regions partitioned into the two-dimensional lattice pattern by the pixel isolation section.

12. The solid-state imaging device according to claim 11, wherein the first and second transistors, at least two transistors different from the first or second transistors, and the photoelectric conversion element are disposed in the pixel region,
the at least two transistors are disposed at positions across the photoelectric conversion element in the pixel region, and
the logarithmic conversion circuit is constituted by using at least one of the at least two transistors in each of the two pixel regions adjacent to each other.

13. The solid-state imaging device according to claim 8, further comprising:
a second chip on which a plurality of the detection circuits is disposed,
wherein the first chip and the second chip constitute a single stacked chip.

14. An imaging device comprising:
the solid-state imaging device according to claim 1; and
a control section that controls the solid-state imaging device.

15. A solid-state imaging device comprising:
a plurality of detection pixels that each output a luminance change of incident light;
a detection circuit that outputs an event signal based on the luminance change output from each of the detection pixels; and
a first common line connecting the plurality of detection pixels to each other,
wherein each of the detection pixels includes:
a photoelectric conversion element;
a logarithmic conversion circuit that converts a photocurrent flowing out of the photoelectric conversion element into a voltage signal corresponding to a logarithmic value of the photocurrent;
a first circuit that outputs a luminance change of incident light incident on the photoelectric conversion element based on the voltage signal output from the logarithmic conversion circuit;
a first transistor connected between the photoelectric conversion element and the logarithmic conversion circuit;
a second transistor connected between the photoelectric conversion element and the first common line; and
a third transistor connected between a first node and a second node, the first node configured to connect the first transistor and the logarithmic conversion circuit to each other, the second node configured to connect the second transistor and the first common line to each other, wherein
the detection circuit includes a second circuit that outputs the event signal based on the luminance change output from each of the detection pixels.

16. A solid-state imaging device comprising:
a plurality of detection pixels that each output a luminance change of incident light;
a detection circuit that outputs an event signal based on the luminance change output from each of the detection pixels; and
a first common line connecting the plurality of detection pixels to each other, wherein each of the detection pixels includes:

a photoelectric conversion element;

a logarithmic conversion circuit that converts a photocurrent flowing out of the photoelectric conversion element into a voltage signal corresponding to a logarithmic value of the photocurrent;

a first circuit that outputs a luminance change of incident light incident on the photoelectric conversion element based on the voltage signal output from the logarithmic conversion circuit;

a first transistor connected between the photoelectric conversion element and the logarithmic conversion circuit;

a second transistor connected between the photoelectric conversion element and the first common line;

a differentiator that generates a differential signal indicating a conversion amount of the voltage signal output from the logarithmic conversion circuit, wherein the detection circuit includes a second circuit that outputs the event signal based on the luminance change output from each of the detection pixels, a selecting section that selects one of the differential signals output from each of the detection pixels, and a comparator that outputs the event signal based on the differential signal.

17. The solid-state imaging device according to claim 16, wherein the comparator includes:

a first comparator that detects that a voltage value of the differential signal exceeds a first threshold and outputs the event signal; and a second comparator that detects that a voltage value of the differential signal has fallen below a second threshold of a voltage level lower than the first threshold and outputs the event signal.

18. An imaging device comprising:

a solid-state imaging device, and a control section that controls the solid-state imaging device, wherein the solid-state imaging device includes a plurality of detection pixels that each output a luminance change of incident light;

a detection circuit that outputs an event signal based on the luminance change output from each of the detection pixels; and a first common line connecting the plurality of detection pixels to each other, wherein each of the detection pixels includes:

a photoelectric conversion element;

a logarithmic conversion circuit that converts a photocurrent flowing out of the photoelectric conversion element into a voltage signal corresponding to a logarithmic value of the photocurrent;

a first circuit that outputs a luminance change of incident light incident on the photoelectric conversion element based on the voltage signal output from the logarithmic conversion circuit;

a first transistor connected between the photoelectric conversion element and the logarithmic conversion circuit; and a second transistor connected between the photoelectric conversion element and the first common line, and wherein the detection circuit includes a second circuit that outputs the event signal based on the luminance change output from each of the detection pixels, the solid-state imaging device includes a plurality of shared blocks including the plurality of detection pixels, and the control section switches an operation mode of the solid-state imaging device to one of a first mode or a second mode, a first mode being a mode of performing transistor on/off in at least one of the plurality of shared blocks, the transistor on/off configured to be performed such that the first and second transistors in one detection image out of the plurality of detection pixels are turned on, the first transistor in at least another detection image out of the plurality of detection pixels is turned off, and the second transistor is turned on, the second mode being a mode of performing transistor on/off in all of the plurality of shared blocks, the transistor on/off configured to be performed such that the first transistor of each of the plurality of detection pixels is turned on, and the second transistor is turned off.

19. The imaging device according to claim 18, wherein the first mode includes:

a third mode and a fourth mode, the third mode being a mode of performing transistor on/off in all of the plurality of shared blocks, the transistor on/off configured to be performed such that the first and second transistors in one detection image out of the plurality of detection pixels are turned on, the first transistor in at least one other detection image out of the plurality of detection pixels is turned off, and the second transistor is turned on, the fourth mode being a mode of performing transistor on/off in a part of the plurality of shared blocks and in remaining shared blocks out of the plurality of shared blocks, the transistor on/off of the fourth mode, when performed in a part of the plurality of shared blocks, configured to be performed such that the first and second transistors in one detection image out of the plurality of detection pixels are turned on, the first transistor in at least one other detection image out of the plurality of detection pixels is turned off, and the second transistor is turned on, the transistor on/off of the fourth mode, when performed in the remaining shared blocks out of the plurality of shared blocks, configured to be performed such that the first transistor of each of the plurality of detection pixels is turned on, and the second transistor is turned off, and the control section switches the operation mode of the solid-state imaging device to one of the second mode to the fourth mode.

* * * * *